(12) United States Patent
Mitani

(10) Patent No.: US 8,716,667 B2
(45) Date of Patent: May 6, 2014

(54) SWITCHING APPARATUS, SWITCHING METHOD, AND ELECTRONIC DEVICE

(75) Inventor: Satoshi Mitani, Kanagawa (JP)

(73) Assignee: Sony Corporation, Tokyo (JP)

( * ) Notice: Subject to any disclaimer, the term of this patent is extended or adjusted under 35 U.S.C. 154(b) by 265 days.

(21) Appl. No.: 13/259,810

(22) PCT Filed: Apr. 6, 2010

(86) PCT No.: PCT/JP2010/056264
§ 371 (c)(1),
(2), (4) Date: Sep. 23, 2011

(87) PCT Pub. No.: WO2010/117006
PCT Pub. Date: Oct. 14, 2010

(65) Prior Publication Data
US 2012/0018637 A1    Jan. 26, 2012

(30) Foreign Application Priority Data

Apr. 6, 2009   (JP) ................. 2009-091962

(51) Int. Cl.
*G01N 21/01* (2006.01)
*G01N 21/55* (2014.01)
*G06K 9/00* (2006.01)

(52) U.S. Cl.
USPC .................................. 250/339.06

(58) Field of Classification Search
USPC ...................................... 250/339.06
See application file for complete search history.

(56) References Cited

U.S. PATENT DOCUMENTS

| 7,446,316 B2* | 11/2008 | Kilgore et al. ........... 250/339.11 |
| 2004/0248523 A1* | 12/2004 | Nishimura et al. ............. 455/78 |
| 2008/0177185 A1 | 7/2008 | Nakao et al. |
| 2010/0148068 A1* | 6/2010 | Schwaneberg et al. .... 250/338.4 |

FOREIGN PATENT DOCUMENTS

| JP | 2002 84177 | 3/2002 |
| JP | 2002 131051 | 5/2002 |
| JP | 2006 338930 | 12/2006 |
| JP | 2008 182360 | 8/2008 |

OTHER PUBLICATIONS

International Search Report Issued Jun. 1, 2010 in PCT/JP10/056264 filed Apr. 6, 2010.

* cited by examiner

*Primary Examiner* — Casey Bryant
(74) *Attorney, Agent, or Firm* — Oblon, Spivak, McClelland, Maier & Neustadt, L.L.P.

(57) ABSTRACT

The present invention relates to a switching apparatus, a switching method, and an electronic device with which it is possible to detect whether or not a proximal object is a human skin.

17 Claims, 19 Drawing Sheets

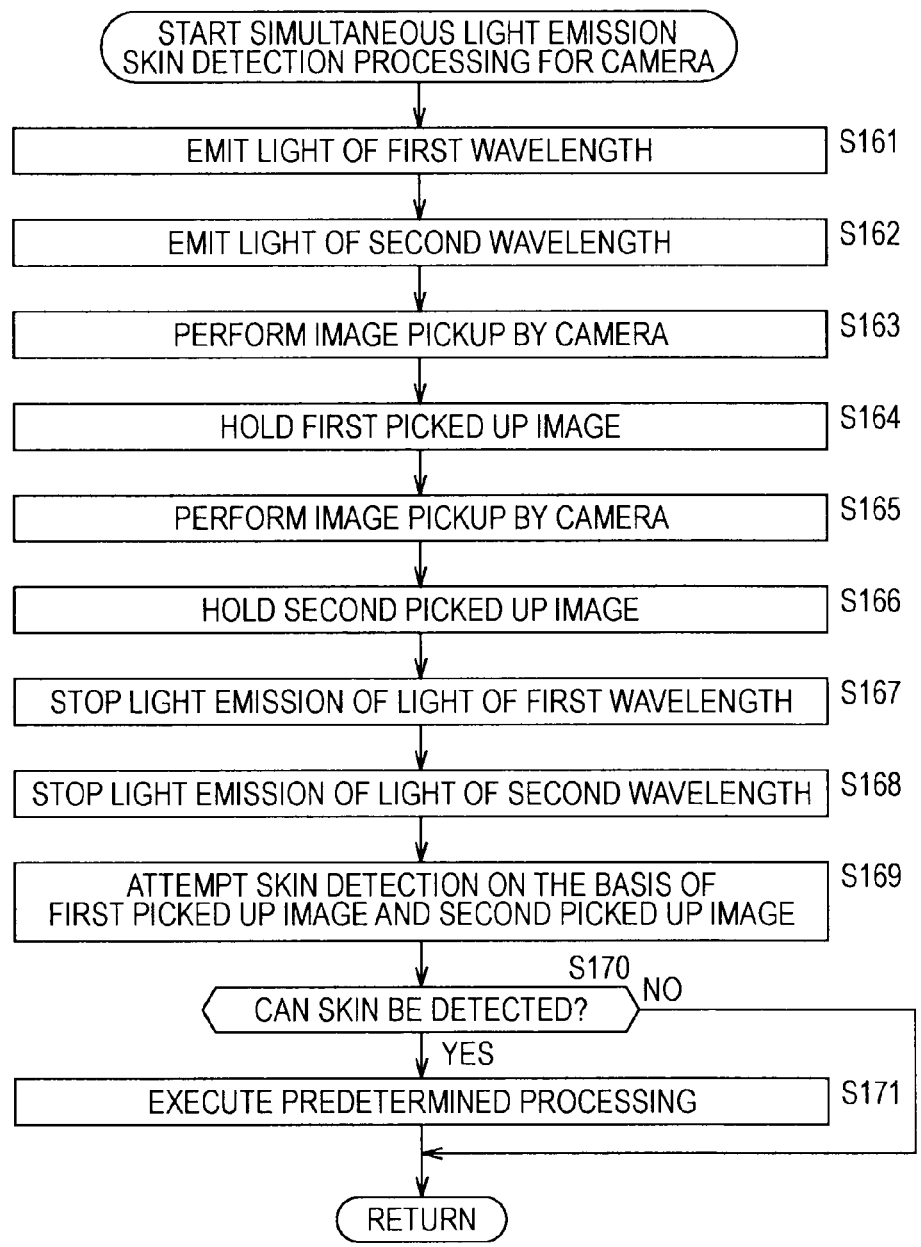

US 8,716,667 B2

SWITCHING APPARATUS, SWITCHING METHOD, AND ELECTRONIC DEVICE

TECHNICAL FIELD

The present invention relates to a switching apparatus, a switching method, and an electronic device, in particular, a switching apparatus, a switching method, and an electronic device with which it is possible to detect whether or not a proximal object is a human skin.

BACKGROUND ART

Up to now, a proximal switch that irradiates light of a predetermined wavelength and detects the presence or absence of a proximal object on the basis of an intensity (light amount) of reflected light of the irradiated light exists (for example, see PTLs 1 and 2).

In this proximity switch, one is configured to detect whether or not the object coming close to the proximity switch exists on the basis of the intensity of the detected reflected light to be switched from ON to OFF or from OFF to ON in a case where the object comes close to the proximity switch, for example.

For this reason, for example, in a case where the proximity switch in related art is used as a switch used for turning on and turning off a lighting apparatus, the lighting apparatus turns on (ON) or turns off (OFF) each time the object comes close thereto.

CITATION LIST

Patent Literature

PTL 1: Japanese Unexamined Patent Application Publication No. 2002-84177
PTL 2: Japanese Unexamined Patent Application Publication No. 2006-338930

SUMMARY OF INVENTION

Technical Problem

However, in the proximity switch in related art, a determination on what the proximal object is cannot be made.

Therefore, in a case where the proximity switch in related art is used for the lighting apparatus or the like that should turn on or turn off only in accordance with an operation by a person, even when a dog, a cat, and the like other than the person come close to the proximity switch, the proximity switch detects those, and the lighting apparatus or the like turns on or turns off in some cases.

The present invention has been made in view of the above-mentioned circumstances and enables a detection on whether or not the proximal object is a human skin.

Solution to Problem

A switching apparatus according to an aspect of the present invention is a switching apparatus that detects a proximity of an object and switches a state of a predetermined electric circuit, the switching apparatus including first light emission means that emits light of a first wavelength, second light emission means that emits light of a second wavelength that is different from the first wavelength, determination means that determines whether or not the object is a human skin on the basis of reflected lights obtained while the lights of the first and second wavelengths are reflected, and switching means that switches the predetermined electric circuit in either state of a first state or a second state that is different from the first state from the first state to the second state in a case where the determination means determines that the object is the human skin.

Detection means that detects an intensity of each of the reflected lights obtained while the lights of the first and second wavelengths are reflected can be further provided, and the determination means can determine whether or not the object is the human skin on the basis of the intensity of each of the reflected lights.

Determination means that determines whether or not a distance with the object is within a predetermined distance on the basis of whether or not the intensity of the reflected light obtained while one light among the lights of the first and second wavelengths is reflected is larger than or equal to a predetermined threshold can be further provided, and in a case where the determination means determines that the distance with the object is within the predetermined distance, the detection means can detect the intensity of each of the reflected lights obtained while the lights of the first and second wavelengths are reflected, the determination means can determine whether or not the object is the human skin on the basis of the intensity of each of the reflected lights of the lights of the first and second wavelengths, and the switching mean can switch the predetermined electric circuit from the first state to the second state in a case where the determination means determines that the object is the human skin.

Mode change means that changes a control mode for controlling light emission by the light emission means that emits the one light among the first and second light emission means in accordance with a frequency in which the determination means determines that the distance with the object is within the predetermined distance and control means that causes the light emission means that emits the one light among the first and second light emission means to emit the light in a frequency for the light emission in accordance with the control mode can be further provided.

Timekeeping means that keeps time can be further provided, and in a case where it is not determined that the distance with the object is within the predetermined distance before a predetermined time elapses since the time is kept, the mode change means can perform a change to a control mode in which the light is emitted in a frequency smaller than the currently set control mode, and in a case where it is determined that the distance with the object is within the predetermined distance before a predetermined time elapses since the time is kept, the mode change means can perform a change to a controlling mode in which the light is emitted in a frequency larger than the currently set control mode.

The first and second light emission means can alternately emit the lights, and the detection means can detect an intensity of the reflected light for each of reflected lights of the alternately emitted lights.

The first and second light emission means simultaneously emit the lights, separation means that separates each of the reflected lights obtained while the lights of the first and second wavelengths are reflected for each wavelength can be further provided, and the detection means can detect an intensity of one separated reflected light among the reflected lights of the lights of the first and second wavelengths and also detect an intensity of the other separated reflected light.

Image pickup apparatus that generates a first picked up image obtained by picking up an image of the object irradiated with the light of the first wavelength on the basis of the reflected light obtained while the light of the first wavelength is reflected and also generates a second picked up image obtained by picking up an image of the object irradiated with the light of the second wavelength on the basis of the reflected light obtained while the light of the second wavelength is reflected can be further provided, and the determination means can use the first and second picked up images generated on the basis of each of the reflected lights and determine whether or not the object is the human skin.

Mode change means that changes the control mode for controlling the light emission by the first and second light emission means in accordance with a frequency in which the determination means determines that the object is the human skin and control means that causes the first and second light emission means to emit the lights in the frequency for the light emission in accordance with the control mode can be further provided.

Timekeeping means that keeps time can be further provided, and the mode change means can perform a change to a control mode in which the light is emitted in a frequency smaller than the currently set control mode in a case where it is not determined that the object is the human skin before the predetermined time elapses since the time is kept and can perform a change to a controlling mode in which the light is emitted in a frequency larger than the currently set control mode in a case where it is determined that the object is the human skin before the predetermined time elapses since the time is kept.

The mode change means can perform a change to a control mode in which only one of the first and second light emission means is caused to emit the light in a case where it is not determined that the object is the human skin before the predetermined time elapses since the time is kept.

Motion determination means that determines whether or not an object in motion exists on the one picked up image on the basis of one picked up image generated by the generation means among the first and second picked up images in a case where the control mode is the control mode in which only one of the first and second light emission means is caused to emit the light can be further provided, and the mode change means can perform a change to a control mode in which the first and second light emission means are caused to emit the lights in a case where it is determined that the object in motion exists on the one picked up image.

The mode change means can perform a change to a control mode in which only the first light emission means that emits the light of the first wavelength that is shorter than the second wavelength is caused to emit the light among the first and second light emission means in a case where it is not determined that the object is the human skin before the predetermined time elapses since the time is kept.

The first and second light emission means can alternately emit the lights, the generation means can generate the first picked up image on the basis of the reflected light received in accordance with the light emission by the first light emission means, and generate the second picked up image on the basis of the reflected light received in accordance with the light emission by the second light emission means.

The first and second light emission means simultaneously emit the lights, separation means that separates each of the reflected lights obtained while the lights of the first and second wavelengths are reflected for each wavelength can be further provided, and the image pickup means can generate the first picked up image on the basis of the reflected light obtained while the light of the first wavelength obtained through the separation is reflected and generate the second picked up image on the basis of the reflected light obtained while the light of the second wavelength obtained through the separation is reflected.

The first and second light emission means can emit lights at wavelengths at which a difference absolute value between a reflection factor of the reflected light obtained while the light of the first wavelength is irradiated and a reflection factor of the reflected light obtained while the light of the second wavelength is irradiated with respect to the human skin is larger than or equal to a predetermined threshold.

The first light emission means can emit light at a wavelength larger than or equal to 630 [nm] and also smaller than or equal to 1000 [nm] and the second light emission means emit light at a wavelength larger than or equal to 900 [nm] and also smaller than or equal to 1100 [nm] as the light at a wavelength shorter than the light emitted by the second light emission means.

The first and second light emission means can emit mutually different infrared lights.

The light emission means can emit light at a wavelength larger than or equal to 940 [nm] and light at a wavelength smaller than 940 [nm] as the mutually different infrared lights.

A switching method according to an aspect of the present invention is a switching method for a switching apparatus that detects a proximity of an object and switches a state of a predetermined electric circuit, the switching apparatus including first light emission means, second light emission means, determination means, and switching means, the switching method including the steps of: emitting light of a first wavelength by the first light emission means, emitting light of a second wavelength that is different from the second wavelength by the second light emission means, determining by the determination means whether or not the object is the human skin on the basis of the reflected lights obtained while the lights of the first and second wavelengths are reflected, and switching the predetermined electric circuit in either state of a first state or a second state that is different from the first state from the first state to the second state by switching means in a case where the determination means determines that the object is the human skin.

An electric device according to an aspect of the present invention is an electric device that detects a proximity of an object and executes a predetermined processing, the electric device including first light emission means that emits light of a first wavelength, second light emission means that emits light of a second wavelength that is different from the first wavelength, determination means that determines whether or not the object is a human skin on the basis of reflected lights obtained while the lights of the first and second wavelengths are reflected, and execution means that executes the predetermined processing in a case where it is determined that the object is the human skin.

According to the one aspect of the present invention, the light of the first wavelength and the light of the second wavelength that is different from the first wavelength are emitted, and it is determined whether or not the proximal object is the human skin on the basis of the reflected lights obtained while the lights of the first and second wavelengths are reflected. Then, in a case where it is determined that the object is the human skin, the predetermined processing is executed.

Advantageous Effects of Invention

According to the present invention, for example, it is possible to detect whether or not the proximal object is the human skin.

BRIEF DESCRIPTION OF DRAWINGS

FIG. 25 is a flow chart for describing a simultaneous light emission skin detection processing for a camera.

DESCRIPTION OF EMBODIMENTS

Hereinafter, embodiments for carrying out the invention (hereinafter, which will be referred to as embodiments) will be described. It should be noted that the description will be made in the following order.
1. First Embodiment (an example of a skin sensor in which two LEDs are caused to alternately emit light)
2. Second Embodiment (an example of a skin sensor in which two LEDs are caused to simultaneously emit light)
3. Third Embodiment (an example of a skin detection button provided with the skin sensor)
4. Fourth Embodiment (an example of an electronic device provided with the skin sensor)
5. Fifth Embodiment (another example of a skin sensor in which two LEDs are caused to alternately emit light)
6. Sixth Embodiment (another example of a skin sensor in which two LEDs are caused to simultaneously emit light)
7. Modified Example

1. First Embodiment

[Configuration Example of Skin Sensor]

Figure 1:
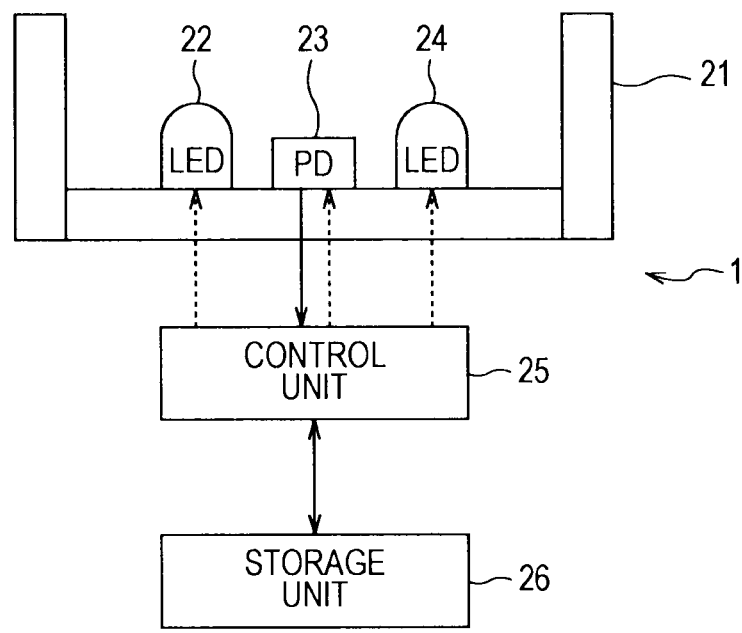
FIG. 1 is a block diagram illustrating a configuration example of a skin sensor according to a first embodiment.

FIG. 1 illustrates a configuration example of a skin sensor 1 according a first embodiment.

This skin sensor 1 is composed of a supporting board 21, an LED (light emitting diode) 22, a PD (photo detector) 23, an LED 24, a control unit 25, and a storage unit 26.

It should be noted that in FIG. 1, an arrow indicated by a dotted line represents a flow of a control signal, and an arrow indicated by a solid line represents a flow of data other than the control signal.

To prevent a positional relation between the LED 22, the PD 23, and the LED 24 from fluctuating, the supporting board 21 supports these.

The LED 22 emits light of a first wavelength (for example, near-infrared ray at 870 [nm]).

The PD 23 is composed, for example, of a light receiving element such as a phototransistor or a photodiode and receives reflected light of the light emitted by the LED 22 and reflected light of the light that is emitted by the LED 24.

Then, the PD 23 detects an intensity of the received reflected light as a voltage, and a detection result obtained as the result is supplied to the control unit 25.

That is, for example, the PD 23 detects the received intensities of the reflected lights of the respective LEDs (the LED 22 and the LED 24) as voltage signals as analog signals, and the control unit 25 performs sampling hold on the detected voltage signals in accordance with light emitting timings of the respective LEDs. It should be noted that this sampling hold can be processed in an analog manner or a digital manner. For example, in a case where the sampling hold is processed in the digital manner, voltage values obtained through sampling (sample) are held by the storage unit 26 as digital signals, and a skin determination processing that will be described below is carried out.

It should be noted that for example, the PD 23 is arranged to be proximal to the LED 22 and the LED 24 as much as possible at an identical distance from each of the LED 22 and the LED 24, so that conditions for a time when the reflected lights of the respective lights emitted by the LED 22 and the LED 24 are detected (for example, incidence angles at a time when the reflected lights are incident and the like) become uniform.

Herein, for the PD 23 and the LEDs 22 and 24, if the skin sensor 1 is configured by using one having a diameter of approximately 5 [mm] for each, it is possible to produce the approximately 2 [cm]-square skin sensor 1.

It should be noted that with regard to the skin sensor 1, by developing an element in which the PD 23 and the LEDs 22 and 24 are put into a unit or the like, a further smaller size can be realized.

The LED 24 emits light of a second wavelength different from the first wavelength (for example, near-infrared ray at 950 [nm]).

It should be noted that the intensity of the light emitted from the LED 22 and the intensity of the light emitted from the LED 24 are set in such a manner that in a case where the light emitted from the LED 22 and the light emitted from the LED 24 are reflected by a mirror surface that reflects either light at a same reflection factor, the respective detection results obtained by the PD 23 become identical to each other.

Also, the first and second wavelengths are decided as wavelengths having a clear difference in a difference between, with respect to the human skin, a reflection factor of the reflected light obtained by irradiating the light of the first wavelength and a reflection factor of the reflected light obtained by irradiating the light of the second wavelength.

This is based on that the control unit 25 determines whether or not the proximal object is the human skin on the basis of the difference between the mutual reflection factors in the skin determination processing that will be described below in FIG. 4.

It should be noted that a reflection factor of the human skin will be described below with reference to FIG. 4.

The control unit 25 controls the LED 22, the PD 23, and the LED 24.

That is, for example, the control unit 25 controls either the LED 22 or the LED 24 (for example, the LED 22) and the PD 23 to perform an object proximity determination processing of determining whether or not the object comes close to the skin sensor 1.

The storage unit 26 previously stores a program and the like for the control unit 25 to execute various processings. Also, the storage unit 26 stores data and the like whose write is instructed from the control unit 25.

[Description on Object Proximity Determination Processing]

Next, with reference to FIG. 2 and FIG. 3, the object proximity determination processing performed by the control unit 25 will be described.

Figure 2:
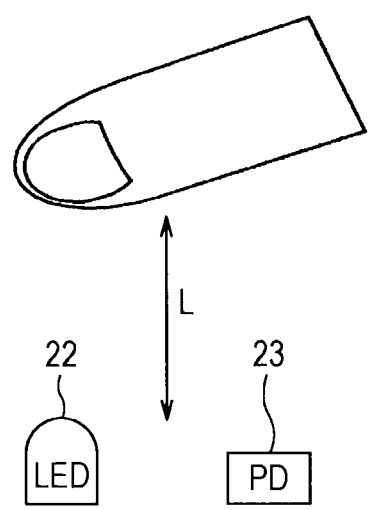
FIG. 2 is a first diagram for describing an object proximity determination processing.

As illustrated in FIG. 2, the control unit 25 causes only either the LED 22 or the LED 24 (for example, the LED 22) to emit light, detect an intensity of light received by the PD 23 (for example, reflected light of the light emitted from the LED 22), and supply a detection result V0 thereof to the control unit 25.

Then, on the basis of the detection result V0 from the PD 23, the control unit 25 determines whether or not an object (a human finger in FIG. 2) comes close, that is, a distance between the object and the PD 23 is within a distance L.

Figure 3:
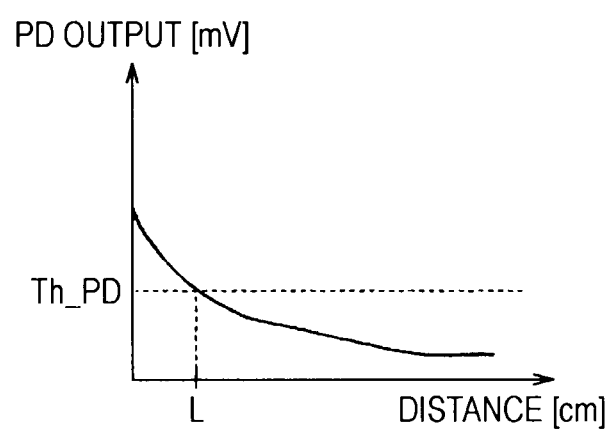
FIG. 3 is a second diagram for describing an object proximity determination processing.

Next, FIG. 3 illustrates input output characteristics of the PD 23.

In FIG. 3, the horizontal axis represents a distance between the PD 23 and the object, and the vertical axis represents the detection result V0 output from the PD 23.

Also, in the vertical axis, a threshold Th_PD is obtained through an experiment or the like which is previously conducted by using the skin sensor 1 and indicates the detection result (voltage) V0 detected by the PD 23 in a case where a distance between the object coming close and the PD 23 is the distance L.

That is, for example, in a case where the distance L is 3 [cm], when the detection result V0 output from the PD 23 is 50 [mV], the threshold Th_PD is set as 50 [mV].

On the basis of whether or not the detection result V0 from the PD 23 is larger than or equal to the threshold Th_PD (for example, 50 [mV]), the control unit 25 determines whether or not the distance between the object and the PD 23 is within the distance L (for example, 3 [cm]).

That is, as illustrated in FIG. 3, in a case where the detection result V0 from the PD 23 is larger than or equal to the threshold Th_PD, the control unit 25 determines that the distance between the object and the PD 23 is within the distance L.

In a case where it is determined that the distance between the object and the PD 23 is within the distance L, the control unit 25 performs the skin determination processing for determining whether or not the object coming close to the skin sensor 1 is the human skin.

[Determination on Skin Determination Processing]

Next, with reference to FIG. 4, the skin determination processing performed by the control unit 25 will be described.

Figure 4:
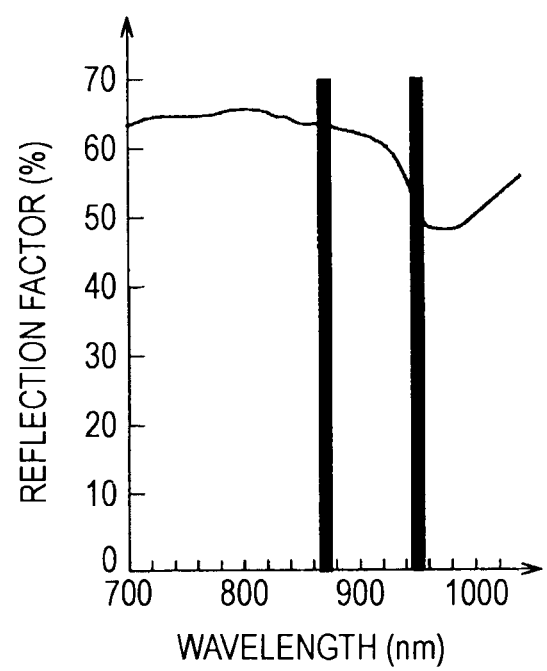
FIG. 4 illustrates a reflection characteristic of a human skin.

FIG. 4 illustrates a reflection characteristic of a human skin with respect to irradiation lights having various wavelengths.

It should be noted that this reflection characteristic has universality irrespective of a color, a condition, and the like of the skin of a person.

In FIG. 4, the horizontal axis indicates a wavelength of light irradiated on the human skin, and the vertical axis indicates a reflection factor of the light irradiated on the human skin.

It is known that the reflection factor of the light irradiated on the human skin has a perk in the vicinity of 800 [nm], drastically decreases from the vicinity of 900 [nm], and increases again having the vicinity of 1000 [nm] as a local minimal value.

To be specific, for example, as illustrated in FIG. 4, with respect to the human skin, the reflection factor of the reflected light obtained by irradiating the light at 870 [nm] is 63[%], and the reflection factor of the reflected light obtained by irradiating the light at 950 [nm] is 50[%].

This is a unique matter with regard to the human skin, and in an object except for the human skin, a change of the reflection factor is often moderate in the vicinity of 800 to 1000 [nm].

For this reason, a difference value Vdif between the reflection factor of the reflected light of the light emitted from the LED 22 (the wavelength is 870 [nm]) and the reflection factor of the reflected light of the light emitted from the LED 24 (the wavelength is 950 [nm]) takes a relatively large value in a case where the proximal object is the human skin and takes a relatively small value in a case where the proximal object is an object except for the human skin.

The control unit 25 determines whether or not the proximal object is the human skin by using a characteristic of the difference value Vdif that becomes a relatively large in a case where the proximal object is the human skin.

That is, for example, the control unit 25 obtains a detection result V1 by detecting the intensity of the reflected light of the light emitted by the LED 22 and a detection result V2 by detecting the intensity of the reflected light of the light that is emitted by the LED 24 from the PD 23.

Then, the control unit 25 calculates the difference value Vdif between the mutual reflection factors of the reflected lights (=V1−V2) on the basis of the obtained detection results V1 and V2. On the basis of the difference value Vdif, the control unit 25 determines whether or not the proximal object has the reflection characteristic illustrated in FIG. 4, that is, whether or not the object is the human skin.

Hereinafter, the determination method will be described in which the control unit 25 calculates the difference value Vdif between the mutual reflection factors of the reflected lights on the basis of the obtained detection results V1 and V2 and determines whether or not the object is the human skin on the basis of the difference value Vdif.

It should be noted that the intensity of the light emitted from the LED 22 is set as x, and the intensity of the light emitted from the LED 24 is set as y.

Then, an attenuation factor of the light attenuating until the light emitted from the LED 22 reaches the object from the LED 22 is set as $\alpha$ (<1). Also, as the LED 22 and the PD 23 are arranged at sufficiently close positions, an attenuation factor of the light attenuating until the light emitted from the LED 22 reaches the PD 23 (the LED 22) after being reflected by the object is also regarded as the same $\alpha$.

Furthermore, an attenuation factor of the light attenuating until the light emitted from the LED 24 reaches the object from the LED 24 is set as $\beta$ (<1). Also, as the LED 24 and the PD 23 are arranged at sufficiently close positions, an attenuation factor of the light attenuating until the light emitted from the LED 24 reaches the PD 23 (the LED 24) after being reflected by the object is also regarded as the same $\beta$.

Herein, a consideration will be given of a case in which an intensity of the reflected light obtained when the light emitted from the LED 22 is reflected by the mirror surface having the reflection factor of 100[%], for example, and an intensity of the reflected light obtained when the light emitted from the LED 24 is reflected by the mirror surface are detected.

In this case, an intensity of the light emitted by the LED 22 at a time when the light reaches the object becomes $\alpha x$, and an intensity of the reflected light obtained by being reflected by the mirror surface becomes $\alpha x$.

Then, the intensity of the reflected light when the reflected light that is reflected by the mirror surface reaches the PD 23 becomes $\alpha^2 x$. At this time, the PD 23 detects the intensity $\alpha^2 x\gamma$ as the detection result V1 ($\gamma$ denotes a sensitivity coefficient with respect to the light of the PD 23 at the wavelength of 870 [nm]).

Also, an intensity of the light emitted by the LED 24 at a time when the light reaches the object becomes $\beta y$, and an intensity of the reflected light obtained by being reflected by the mirror surface becomes $\beta y$.

Then, the intensity of the reflected light when the reflected light that is reflected by the mirror surface reaches the PD 23 becomes $\beta^2 y$. At this time, the PD 23 detects the intensity $\beta^2 y\delta$ as the detection result V2 ($\delta$ denotes a sensitivity coefficient with respect to the light of the PD 23 at the wavelength of 950 [nm]).

It should be noted that the intensity x of the light emitted from the LED 22 and the intensity y of the light emitted from the LED 24 are set in such a manner that the detection results V1 and V2 obtained by the PD 23 become identical to each other in a case where the light emitted from the LED 22 and the light emitted from the LED 24 are reflected by the mirror surface.

Therefore, $\alpha^2 x\gamma$ and $\beta^2 y\delta$ become identical values.

Next, a consideration will be given of a case in which an intensity of the reflected light obtained when the light emitted from the LED 22 is reflected by the human skin and an intensity of the reflected light obtained when the light emitted from the LED 24 is reflected by the human skin are detected.

In this case, an intensity of the light emitted by the LED 22 at a time when the light reaches the human skin becomes $\alpha x$, and an intensity of reflected light obtained when the light is reflected by the human skin whose reflection factor with respect to the light at 870 [nm] is 63% becomes $0.63\alpha x$.

Then, an intensity of the reflected light that is reflected by the human skin when the light reaches the PD 23 becomes $0.63\alpha^2 x$. At this time, the PD 23 detects $0.63\alpha^2 x\gamma$ as the detection result V1.

Also, an intensity of the light emitted by the LED 24 at a time when the light reaches the human skin becomes $\beta y$, and an intensity of reflected light obtained when the light is reflected by the human skin whose reflection factor with respect to the light at 950 [nm] is 50% becomes $0.5\beta y$.

Then, an intensity of the reflected light that is reflected by the human skin when the light reaches the PD 23 becomes $0.5\beta^2 y$. At this time, the PD 23 detects $0.5\beta^2 y\delta$ as the detection result V2.

As described above, $\alpha^2 x\gamma$ and $\beta^2 y\delta$ are the identical values.

Therefore, the control unit 25 calculates a difference value $0.13\alpha^2 x\gamma$ obtained by subtracting the intensity $0.5\beta^2 y\delta$ (=$0.5\alpha^2 x\gamma$) detected as the detection result V2 from the intensity $0.63\alpha^2 x\gamma$ detected as the detection result V1, as the difference value Vdif which represents the difference between the mutual reflection factors.

For example, in a case where the distance L is 1 [cm], when the detection result V1 output from the PD 23 is 450 [mV], the difference value Vdif becomes 92.8 [mV].

On the basis of the difference value Vdif, the control unit 25 determines whether or not the proximal object is the human skin.

To be specific, for example, the control unit 25 determines whether or not the proximal object is the human skin on the basis of whether or not the calculated difference value Vdif is larger than or equal to a previously set threshold.

It should be noted that for the previously set threshold, for example, a value that is sufficiently larger than the difference value Vdif calculated with respect to an object except for the human skin and is equal to or smaller than the difference value Vdif (for example, a value $0.13\alpha^2 x\gamma$) calculated with respect to the human skin.

Also, for example, the control unit 25 may normalize (divide) the difference value Vdif by the detection result V1 and determine whether or not the proximal object is the human skin on the basis of a division result Rdif obtained as the result (=Vdif/V1).

That is, the control unit 25 determines whether or not the division result Rdif is larger than or equal to a predetermined threshold, and in a case where it is determined that the division result Rdif is larger than or equal to the predetermined threshold, the proximate object is the human skin.

It should be noted that the predetermined threshold is set while taking into account the value 0.21 that is logically obtained from the difference in the reflection factors. According to an experiment previously conducted by the applicant of the present application, with regard to the predetermined threshold, a relatively satisfactory result is obtained in the case of setting approximately 0.1 to 0.15 while a slight margin is given to the value 0.21.

In the following description, the control unit 25 is configured to determine whether or not the proximal object is the human skin on the basis of the division result Rdif obtained by dividing the difference value Vdif by the detection result V1.

[Operation Description in Mutual Light Emission Detection Processing]

Next, a description will be given on a detail of a mutual light emission skin detection processing with which it is detected whether or not a proximal object is a human skin while the LED 22 and the LED 24 are caused to mutually (alternately) emit light by the skin sensor 1.

Figure 5:
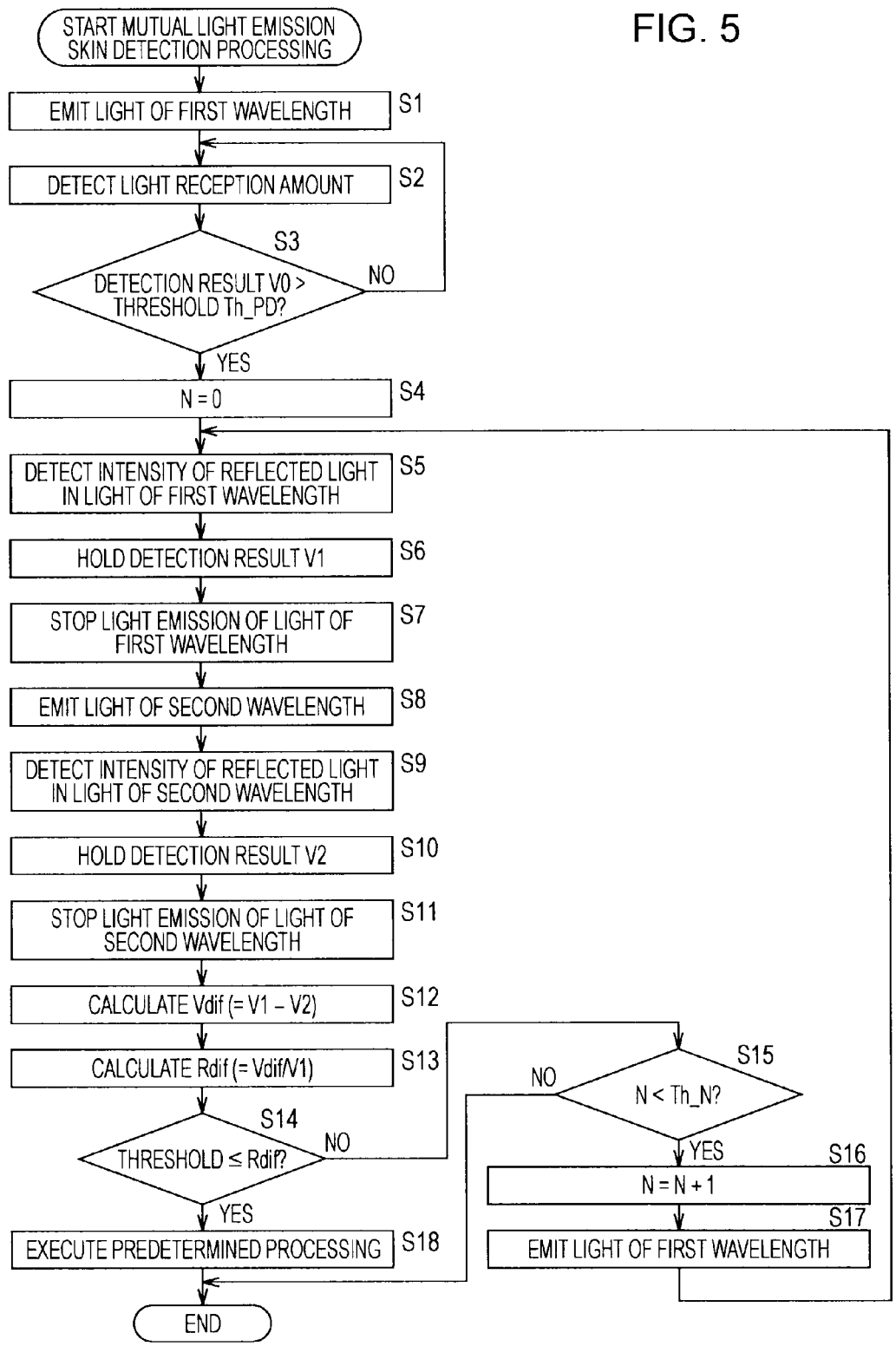
FIG. 5 is a flow chart for describing a mutual light emission skin detection processing.

FIG. 5 is a flow chart for describing the mutual light emission skin detection processing.

This mutual light emission skin detection processing is started, for example, when a start of the mutual light emission skin detection processing is instructed by the control unit 25.

In step S1 to step S3, an object proximity determination processing is carried out.

That is, in step S1, the LED 22 turns on while following a control by the control unit 25 and emits the light of the first wavelength.

In step S2, the PD 23 starts light reception and supplies a voltage in accordance with a light reception amount from the light reception to the control unit 25 as the detection result V0.

In step S3, the control unit 25 determines whether or not an object comes close within the distance L from the PD 23 on the basis of whether or not the detection result V0 from the PD 23 is larger than the threshold Th_PD. Then, in a case where the detection result V0 from the PD 23 is not larger than the threshold Th_PD, the control unit 25 determines that the object does not come close, the process returns to step S2, and thereafter, a similar processing is repeated.

Also, in step S3, in a case where the detection result V0 from the PD 23 is larger than the threshold Th_PD, the control unit 25 determines that the object comes close, and the process proceeds to step S4.

Then, in the processing in step S4 and thereafter, a skin determination processing of determining whether or not the proximal object is the human skin is carried out.

In step S4, the control unit 25 holds a counter N for counting the number of times for carrying out the processing in step S5 to step S14 and sets the counter N as 0 (initialization).

In step S5, the PD 23 receives the reflected light of the light emitted by the LED 22. Then, the PD 23 detects an intensity of the received reflected light and supplies a detection result V1 obtained as the result to the control unit 25.

In step S6, the control unit 25 holds the detection result V1 from the PD 23 obtained through the processing in step S5.

It should be noted that in step S6, the control unit 25 may also hold the detection result V0 detected by the PD 23 in the immediately preceding processing in step S2 as the detection result V1. In this case, as it is possible to omit the processing in step S5, the mutual light emission skin detection processing can be carried out more promptly.

In step S7, the LED 22 turns off while following the control by the control unit 25 and stops the light emission of the light of the first wavelength.

In step S8, the LED 24 turns on while following the control by the control unit 25 and emits the light of the second wavelength.

In step S9, the PD 23 receives the reflected light of the light emitted by the LED 24. Then, the PD 23 detects an intensity of the received reflected light and supplies a detection result V2 obtained as the result to the control unit 25.

In step S10, the control unit 25 holds the detection result V2 from the PD 23.

In step S11, the LED 24 turns off while following the control by the control unit 25 and stops the light emission of the light of the second wavelength.

In step S12, the control unit 25 subtracts the similarly held detection result V2 from the held detection result V1, and obtains the difference value Vdif (=V1−V2) that is obtained as the result and represents the difference between the mutual reflection factors.

In step S13, the control unit 25 divides the obtained difference value Vdif by the detection result V1 and obtains the division result Rdif (=Vdif/V1) obtained as the result.

In step S14, the control unit 25 determines whether or not the obtained division result Rdif is larger than or equal to the predetermined threshold.

It should be noted that in step S14, the control unit 25 may determine whether or not the division result Rdif is larger than or equal to the predetermined threshold and also is smaller than or equal to another threshold which is larger than the predetermined threshold. This is because, in a case where an object that absorbs the light in the vicinity of 950 [nm] like the skin, it is determined that the object is other than the skin from a difference of the absorption factor, so that a reliability for the determination is to be improved.

That is, on the basis of a reflection characteristic similar to the skin, in a case where an object that reflects the light in the vicinity of 950 [nm] exists, it is determined that the object is other than the skin from a difference of the reflectance factors (which is set to be larger than the difference of the reflectance factors of the skin), and the reliability for the determination is to be improved.

It should be noted that for example, in a case where the object that reflects the light exists on the basis of the reflection characteristic similar to the skin and the division result Rdif obtained in the object is larger than the division result Rdif obtained in the human skin, a value that is larger than the division result Rdif obtained in the human skin and smaller than the division result Rdif obtained in the object having the reflection characteristics similar to the skin is adopted as the other threshold.

In step S14, in a case where the control unit 25 determines that the obtained division result Rdif is not larger than or equal to the predetermined threshold, the process proceeds to step S15.

In step S15, the control unit 25 determines whether or not the counter N is smaller than a previously decided number of times Th_N. Then, in a case where the control unit 25 determines that the counter N is not smaller than the number of times Th_N, the processing is ended.

Also, in step S15, in a case where the control unit 25 determines that the counter N is smaller than the number of times Th_N, the process proceeds to step S16.

In step S16, the control unit 25 adds a value 1 to the held counter N and sets an addition result obtained as the result as a new counter N.

In step S17, the LED 22 turns on while following the control by the control unit 25 and emits the light of the first wavelength. After that, the process returns to step S5, and thereafter, a similar processing is repeated.

Also, in step S14, in a case where the control unit 25 determines that the obtained division result Rdif is larger than or equal to a predetermined threshold, the process proceeds to step S18.

In step S18, the control unit 25 determines that the proximate object is the human skin and executes a corresponding predetermined processing.

That is, for example, the control unit 25 executes a processing on an electric circuit that is not illustrated in the drawing having either a first state (for example, an off state) or a second state which is different from the first state (for example, an on state) for switching from the first state to the second state.

It should be noted that the above-mentioned series of skin determination processing can be processed in an analog manner or also processed in a digital manner.

With that, the mutual light emission skin detection processing is ended.

As described above, in the mutual light emission skin detection processing, through the object proximity determination processing in step S1 to step S3, either the LED 22 or the LED 24 (for example, the LED 22) is caused to emit light, and in a case where it is determined that (a detection result of) an intensity of the reflected light of the emitted light is larger than the threshold Th_PD, the distance between the object and the PD 23 is within the distance L, and the skin determination processing in step S4 and thereafter is executed.

Therefore, in the mutual light emission detection processing, irrespective of whether or not the distance between the PD 23 and the object is the distance L, as compared with the case of repeatedly executing the skin determination processing in step S4 and thereafter, consumed power can be reduced.

Also, in the mutual light emission skin detection processing, (light of) near-infrared ray that cannot be seen by people is caused to be emitted from the LED 22 and the LED 24.

Therefore, even if the skin sensor 1 is installed at a location visible to human eyes, as the lights emitted from the LED 22 and the LED 24 cannot be visually recognized, the persons do not have unpleasant experiences because the lights emitted from the LED 22 and the LED 24 are too bright.

Also, for example, even in a case where the skin sensor 1 is applied to a crime-prevention sensor that generates electronic sound or the like when a person comes close, as the lights emitted from the LED 22 and the LED 24 cannot be visually recognized, it is possible to install the crime-prevention sensor without bringing the existence of the crime-prevention sensor to attention.

Furthermore, in the mutual light emission detection processing, as the LED 22 and the LED 24 are caused to emit the lights separately, the intensity of the reflected light of the light emitted by the LED 22 and the intensity of the reflected light of the light emitted by the LED 24 can be detected by the single PD 23.

Also, in the mutual light emission detection processing, in step S14, in a case where it is determined that the object coming close to the PD 23 is not the human skin, the processing in step S5 to step S14 is set to be repeated by the number of times which is the number of times Th_N at maximum.

Therefore, in the mutual light emission detection processing, even if due to an influence of noise or the like, the division result Rdif larger than or equal to the predetermined threshold that should be originally obtained cannot be obtained, as the processing in step S5 to step S14 is carried out again (repeated), and as compared with the case in which the processing in step S5 to step S14 is carried out only once, it is possible to conduct a more precise determination.

It should be noted that in the mutual light emission detection processing, in a case where a determination is made on whether or not the object is the human skin on the basis of the detection results V1 and V2 detected in a case in which the distance between the proximate object and the PD 23 is the identical distance, it is possible to conduct the most accurate determination.

Therefore, so that the distance at a time when the intensity of the reflected light of the light emitted by the LED 22 is detected and the distance at a time when the intensity of the reflected light of the light that is emitted by the LED 24 is detected are set as almost the identical distance, it is desired that the LED 22 and the LED 24 are caused to emit lights at an extremely short interval such as, for example, 20 [ms].

2. Second Embodiment

[Another Configuration Example of Skin Sensor]

Figure 6:
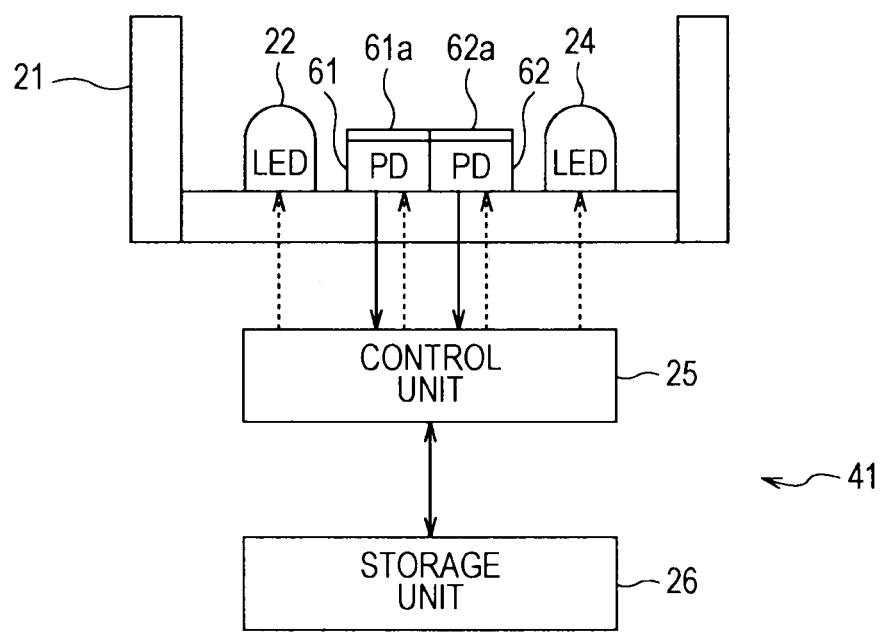
FIG. 6 is a block diagram illustrating a configuration example of a skin sensor according to a second embodiment.

Next, FIG. 6 illustrates a configuration example of a skin sensor 41 according to a second embodiment.

It should be noted that in this skin sensor 41, parts configured in a similar manner to the skin sensor 1 according to the first embodiment are assigned with the same reference signs, and a description thereof will be omitted hereinafter.

That is, the skin sensor 41 is configured in a similar manner to the skin sensor 1 according to the first embodiment except for that a PD 61 and a PD 62 are provided instead of the PD 23.

The PD 61 has a light reception surface thereof (surface that receives reflected light) covered with a spectral filter 61*a*.

The spectral filter 61*a* is a band-pass filter that transmits only the first wavelength (for example, 870 [nm]).

That is, the spectral filter 61*a* transmits only the reflected light of the light emitted by the LED 22 among the reflected light of the light emitted by the LED 22 and the reflected light of the light that is emitted by the LED 24 to be received by the reception surface of the PD 61.

The PD 61 receives the reflected light of the light emitted by the LED 22 which is transmitted through the spectral filter 61*a*.

Then, the PD 61 detects an intensity of the received reflected light as a voltage and supplies the detection result V1 obtained as the result to the control unit 25.

The PD 62 has a light reception surface thereof covered with a spectral filter 62*a*.

The spectral filter 62*a* is a band-pass filter that transmits only the second wavelength (for example, 950 [nm]) that is different from the first wavelength.

That is, the spectral filter 62*a* transmits only the reflected light of the light that is emitted by the LED 24 among the reflected light of the light emitted by the LED 22 and the reflected light of the light that is emitted by the LED 24 to be received by the light reception surface of the PD 62.

The PD 62 receives the reflected light of the light that is emitted by the LED 24 which is transmitted through the spectral filter 62*a*.

Then, the PD 62 detects an intensity of the received reflected light as a voltage and supplies the detection result V2 obtained as the result to the control unit 25.

[Operation Description in Simultaneous Light Emission Detection Processing]

Next, a description will be given of a detail of a simultaneous light emission skin detection processing while the LED 22 and the LED 24 are caused to simultaneously emit light by the skin sensor 41 with which it is detected whether or not a proximal object is a human skin.

Figure 7:
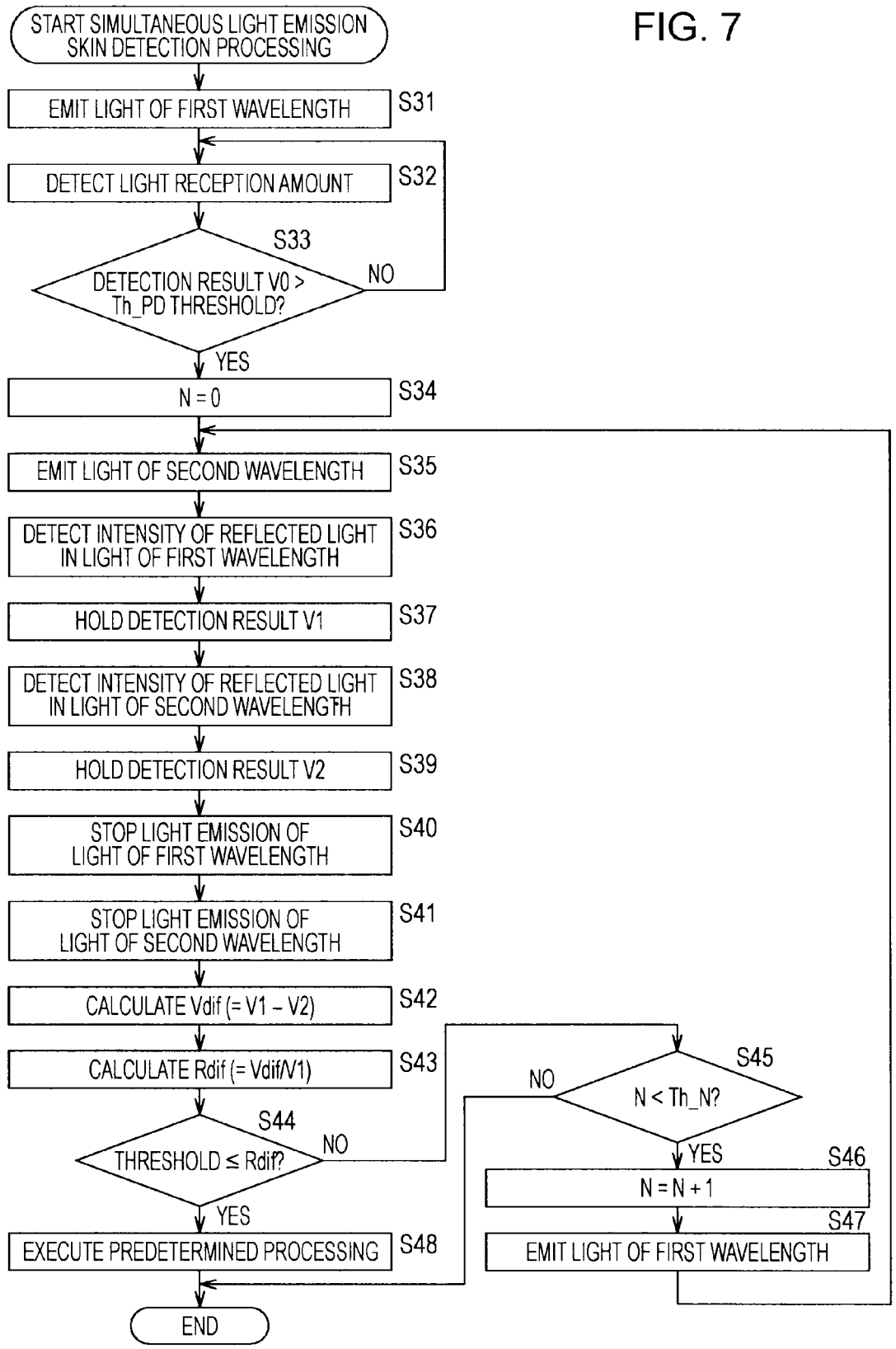
FIG. 7 is a flow chart for describing a simultaneous light emission skin detection processing.

FIG. 7 is a flow chart for describing the simultaneous light emission skin detection processing.

This simultaneous light emission skin detection processing is started, for example, when a start of the processing is instructed by the control unit 25.

In step S31 to step S33, the object proximity determination processing is carried out. As this object proximity determination processing is similar to step S1 to step S3 of FIG. 5, a description thereof will be omitted.

In step S34, the control unit 25 holds a counter N for counting the number of times for carrying out the processing in step S35 to step S44 and sets the counter N as 0 (initialization).

In step S35, the LED 24 turns on while following the control by the control unit 25 and emits the light of the second wavelength.

According to this, both the LED 22 and the LED 24 emit the lights, and the PD 61 and the PD 62 are irradiating with the reflected light of the light emitted by the LED 22 and the reflected light of the light emitted by the LED 24.

In step S36, the PD 61 receives only the reflected light of the light emitted by the LED 22 which is transmitted through the spectral filter 61*a* among the reflected light of the light emitted by the LED 22 and the reflected light of the light emitted by the LED 24. Then, the PD 61 detects an intensity of the received reflected light and supplies a detection result V1 obtained as the result to the control unit 25.

In step S37, the control unit 25 holds the detection result V1 from the PD 61.

In step S38, the PD 62 receives only the reflected light of the light emitted by the LED 24 which is transmitted through the spectral filter 62*a* among the reflected light of the light emitted by the LED 22 and the reflected light of the light emitted by the LED 24. Then, the PD 62 detects an intensity of the received reflected light and supplies a detection result V2 obtained as the result to the control unit 25.

In step S39, the control unit 25 holds the detection result V2 from the PD 62.

In step S40, the LED 22 turns off while following the control by the control unit 25 and stops the light emission of the light of the first wavelength.

In step S41, the LED 24 turns off while following the control by the control unit 25 and stops the light emission of the light of the second wavelength.

In step S42 to step S48, a processing similar to step S12 to step S18 of FIG. 5 is carried out.

With that, the simultaneous light emission skin detection processing is ended.

As described above, in the simultaneous light emission skin detection processing, the LED 22 and the LED 24 are simultaneously turned on, the distances between the object and the PD 61 and the PD 62 are the identical distance, the intensity of the reflected light of the light emitted by the LED 22 and the intensity of the reflected light of the light that is emitted by the LED 24 are detected, and on the basis of the detection results V1 and V2, a determination is made on whether or not the proximal object is the human skin.

Therefore, in the simultaneous light emission skin detection processing, the determination is made on whether or not the object is the human skin on the basis of the detection results V1 and V2 detected in the identical distance, and as compared with the case in which the determination is made on the basis of the detection results V1 and V2 detected in different distances, it is possible to more accurately determine whether or not the proximal object is the human skin.

3. Third Embodiment

[External Appearance in Skin Detection Button]

Figure 8:
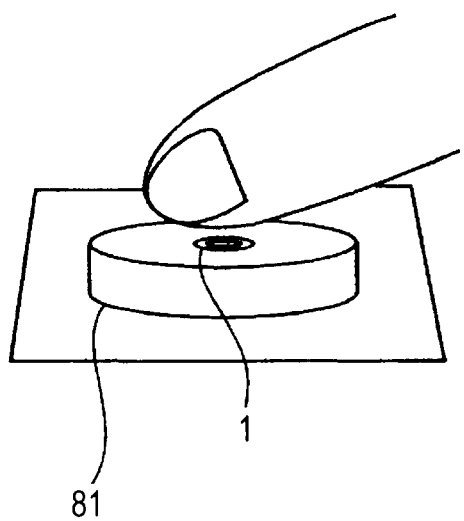
FIG. 8 illustrates an external appearance of a skin detection button according to a third embodiment.

Next, FIG. 8 illustrates an external appearance of a skin detection button 81 according to a third embodiment.

This skin detection button 81 is a push-button type button where the skin sensor 1 is arranged in the middle of the skin detection button 81, and in accordance with the press, the alternate light emission skin detection processing by the skin sensor 1 is carried out.

When the skin detection button 81 is pressed by an object, as a distance between the object and the skin sensor 1 becomes (almost) 0, it is possible to set the predetermined threshold while taking into account only the difference value Vdif calculated in a case where the distance between the object and the skin sensor 1 is 0.

It should be noted that the skin detection button 81 is configured so as to include the skin sensor 1, but the skin sensor 41 can adopted instead of the skin sensor 1. In this case, in accordance with the press, in the skin detection button 81, the simultaneous light emission skin detection processing by the skin sensor 41 is carried out.

Also, according to the third embodiment, the skin sensor 1 is activated by pressing the skin detection button 81, but as a trigger for the skin sensor 1 to start operations, in accordance with a detection that the distance between the object and the skin sensor 1 is smaller than or equal to as prescribed, any may be used so long as the skin sensor 1 can be caused to execute the alternate light emission skin detection processing.

That is, for example, it is possible to adopt a distance detection switch for detecting the distance between the object and the skin sensor 1 and causing the skin sensor 1 to execute the alternate light emission skin detection processing in a case where the detected distance is smaller than or equal to as prescribed, a touch panel for causing the skin sensor 1 to execute the alternate light emission skin detection processing in accordance with a contact by the object, or the like.

4. Fourth Embodiment

Next, with reference to FIG. 9 to FIG. 13, an example of an electronic device provided with the skin sensor 1 will be described.

It should be noted that the electronic device can be configured to be provided with the skin sensor 41 or the skin detection button 81 instead of the skin sensor 1, but the configuration is similar to the case in which the skin sensor 1 is provided, and hereinafter, a description will be omitted.

[External Appearance of Personal Computer Provided with Skin Sensor]

Figure 9:
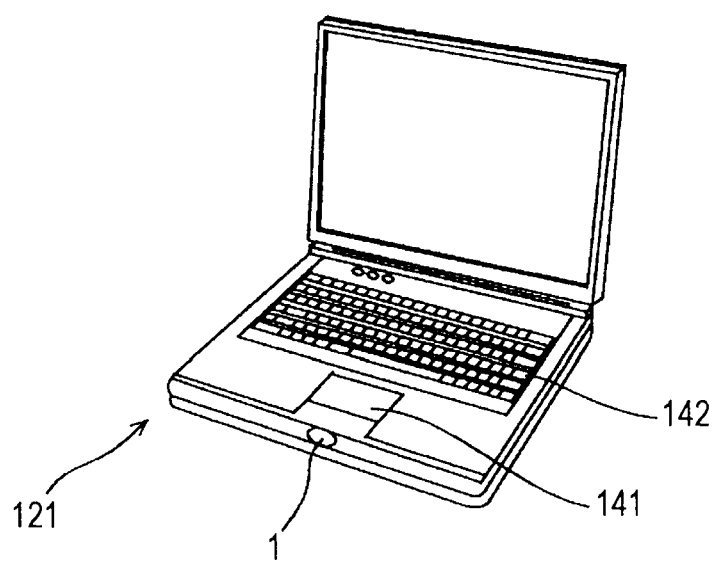
FIG. 9 illustrates an external appearance of a personal computer provided with a skin sensor.

FIG. 9 illustrates an external appearance of a personal computer 121 provided with the skin sensor 1.

This personal computer 121 is a so-called note-type personal computer and is composed of a touch pad 141 arranged near the skin sensor 1, a key board 142, a display, and the like, in addition to the skin sensor 1.

This personal computer 121 enables an input by the touch pad 141 only during a period in which the skin sensor 1 determines that a thumb or the like of a user is in contact with the skin sensor 1.

In a case where the user attempts to operate the touch pad 141, the thumb or the like of the user is to be in contact with the skin sensor 1. It should be noted that in a case where the key board 142 is operated, as the skin sensor 1 is provided while sandwiching the touch pad 141 from the key board 142, the skin (hand) of the user has (almost) no contact with the skin sensor 1.

Therefore, in a case where the user is operating the key board 142, even when a wrist of the user or a sleeve part of cloth is accidentally in contact with the touch pad 141, it is possible to prevent the touch pad 141 from erroneously operating, and the operability can be improved.

Also, the configuration illustrated in FIG. 9 is not limited to the personal computer 121.

That is, for example, a mobile phone device that can enable or disable (cancel) a lock function of locking the operation even when the button is pressed can be configured to be provided with the skin sensor 1.

In this case, for example, a configuration can be set in which the lock function is enabled in a case where the skin sensor 1 determines that the user does not hold the mobile phone device and the lock function is disabled in a case where the skin sensor 1 determines that the user holds the mobile phone device.

In the thus configured mobile phone device, while the user does not operate an operation of disabling the lock function, the lock function is disabled by only holding the mobile phone device by the user to use the mobile phone device, and therefore the operability can be further improved.

[External Appearance of Digital Still Camera Provided with Skin Sensor]

Figure 10:
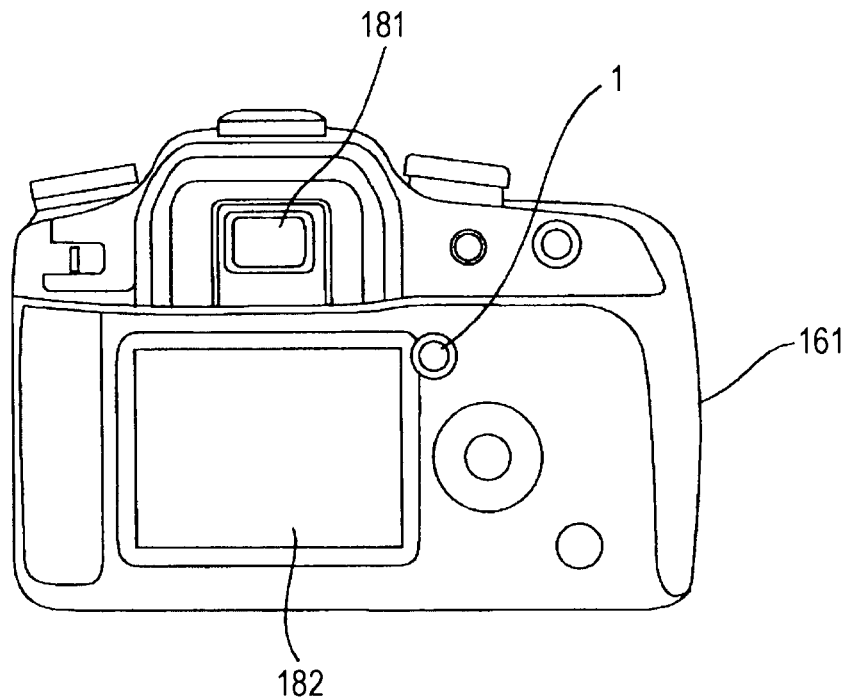
FIG. 10 illustrates an external appearance of a digital still camera provided with the skin sensor.

Next, FIG. 10 illustrates an external appearance of a digital still camera 161 provided with the skin sensor 1.

In this digital still camera 161, for example, one of an image pickup mode for performing an image pickup (imaging) while seeing into a viewfinder 181 and a reproduction mode for performing a reproduction (display) of a picked up image obtained through the image pickup in the image pickup mode is set. It should be noted that in the digital still camera 161, in general, the reproduction is set.

The digital still camera 161 is composed of the viewfinder 181, a display unit 182 that displays the picked up image, a release switch, and the like. Also, in the digital still camera 161, as a position where the skin of the user (for example, face) is in contact with the skin sensor 1 in a case where the user sees into the viewfinder 181, for example, the skin sensor 1 is arranged at a position between the viewfinder 181 and the display unit 182.

In the digital still camera 161, in a case where the skin sensor 1 determines that the skin of the user is in contact with the skin sensor 1, that is, in a case where the user sees into the viewfinder 181, the set mode is switched from the reproduction mode to the image pickup mode.

Also, in the digital still camera 161, in a case where the skin sensor 1 determines that the skin of the user is not in contact with the skin sensor 1, that is, in a case where the user does not see into the viewfinder 181, the set mode is switched from the image pickup mode to the reproduction mode.

In the digital still camera 161, in a case where the skin sensor 1 determines that the user sees into the viewfinder 181, the switch is made from the reproduction mode to the image pickup mode, and in a case where the skin sensor 1 determines that the user does not see into the viewfinder 181, the switch is made from the image pickup mode to the reproduction mode.

Therefore, in the digital still camera 161, as it becomes unnecessary for the user to perform the switching operation from the reproduction mode to the image pickup mode or from the image pickup mode to the reproduction mode, the usability of the digital still camera 161 can be improved.

It should be noted that it is also possible to apply the configuration by the digital still camera 161 to a video camera or the like that picks up a moving image.

[External Appearance of Roentgen Imaging Aapparatus Provided with Skin Sensor]

Figure 11:
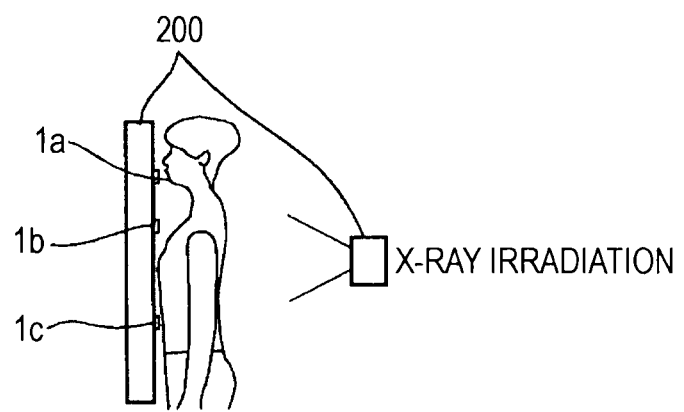
FIG. 11 illustrates an external appearance of a roentgen image pickup apparatus provided with the skin sensor.

Next, FIG. 11 illustrates an external appearance of a roentgen image pickup apparatus 201 provided with a skin sensor 1*a* to a skin sensor 1*c* having a function similar to the skin sensor 1.

This roentgen image pickup apparatus 201 determines whether or not a patient (upper body is naked) takes an appropriate posture for carrying out the roentgen image pickup by the skin sensor 1*a* to the skin sensor 1*c*. Then, in a case where the skin sensor 1 determines that the patient takes the appropriate posture, the roentgen image pickup apparatus 201 irradiates X-rays to perform the roentgen image pickup.

That is, for example, in the roentgen image pickup apparatus 201, in a case where the roentgen image pickup is performed, a skin sensor 1*a*, a skin sensor 1*b*, and a skin sensor 1*c* are respectively provided at locations contacted by the jaw, both shoulders, and abdominal part of the patient.

In a case where the skin sensor 1*a*, the skin sensor 1*b*, and the skin sensor 1*c* determine that the jaw, both shoulders, and abdominal part of the patient are contacted at the locations to be contacted by the jaw, both shoulders, and abdominal part of the patient, the roentgen image pickup apparatus 201 enables the operation for performing the roentgen image pickup.

Therefore, in the roentgen image pickup apparatus 201, in a case where at least one of the jaw, both shoulders, and abdominal part of the patient is not contacted at the locations to be contacted by the jaw, both shoulders, and abdominal part of the patient, it is possible to prevent the roentgen image pickup from being erroneously carried out.

[External Appearance of Blood-Pressure Meter Provided with Skin Sensor]

Figure 12:
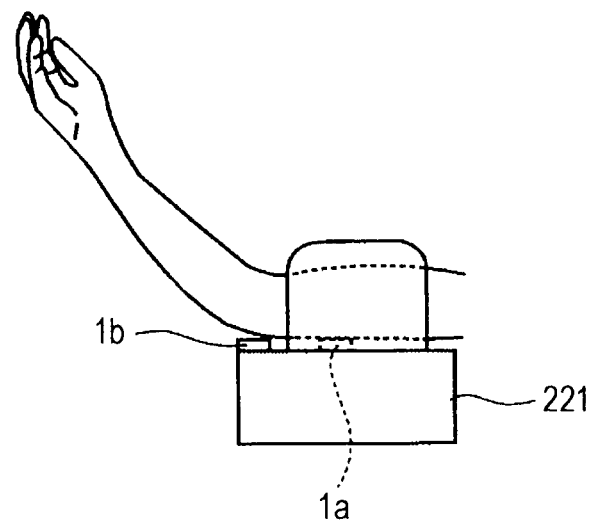
FIG. 12 illustrates an external appearance of a blood-pressure meter provided with the skin sensor.

Next, FIG. 12 illustrates an external appearance of a blood-pressure meter 221 provided with the skin sensor 1*a* and the skin sensor 1*b* having a function similar to the skin sensor 1.

In this blood-pressure meter 221, the skin sensor 1*a* and the skin sensor 1*b* determine whether or not the patient takes an appropriate posture for measuring a blood pressure.

Then, in a case where the skin sensor 1*a* and the skin sensor 1*b* determine that the patient takes the appropriate posture, the blood-pressure meter 221 performs the measurement on the blood pressure.

That is, for example, in the blood-pressure meter 221, in a case where an operation of measuring the blood pressure is carried out, the skin sensor 1*a* and the skin sensor 1*b* are respectively provided at locations to be contacted by an elbow and an upper arm of the patient.

In a case where the skin sensor 1*a* and the skin sensor 1*b* determine that the elbow and the upper arm of the patient are in contact with locations to be contacted by the elbow and the upper arm of the patient, the blood-pressure meter 221 enables the operation for measuring the blood pressure.

Therefore, in the blood-pressure meter 221, in a case where at least one of the elbow and the upper arm of the patient is not in contact with locations to be contacted by the elbow and the upper arm of the patient, it is possible to prevent the measurement for the blood pressure from erroneously being carried out.

Also, for example, in a facial treatment device that removes fleck or the like on the face by irradiating laser, the skin sensor 1 is provided at a front edge of an irradiation part for irradiating the laser, and it is possible to set a configuration in which the laser is irradiated from the irradiation part only in a case where the skin sensor 1 determines that the skin comes close to the irradiation part.

In this case, as the laser is irradiated from the irradiation part of the facial treatment device only when the skin comes close to the irradiation part, the laser is not irradiated on an object except for the skin (for example, eyes or the like), and the safety is improved.

Furthermore, like an oxygen mask, drip infusion, or the like, if the skin sensor 1 is provided to an object that appropriately functions in a state of being in contact with the patient, by determining by the skin sensor 1 whether or not the oxygen mask, drip infusion, or the like is in contact with the skin of the patient, it is possible to detect whether or not the oxygen mask, drip infusion, or the like is appropriately in contact with (added to) the patient.

[External Appearance of Door Key Provided with Skin Sensor]

Figure 13:
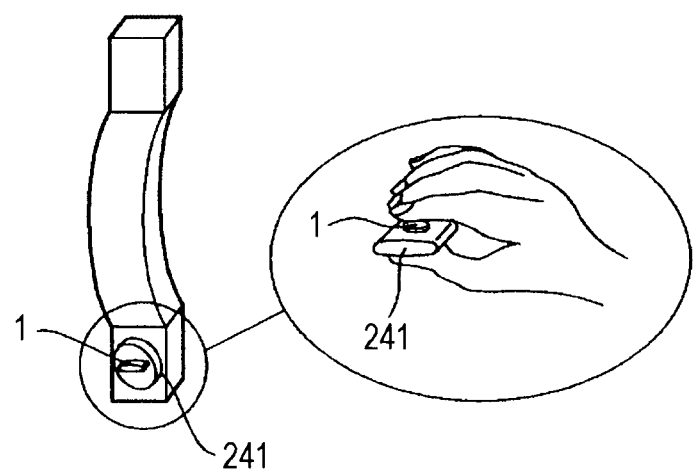
FIG. 13 illustrates an external appearance of a door key provided with the skin sensor.

Next, FIG. 13 illustrates an external appearance of a door key (thumbturn) 241 provided with the skin sensor 1.

This door key 241 is rotated, for example, for performing lockup or unlock of the key for an inner side of a hallway (room side). The door key 241 can be rotated only by a finger or the like of a person.

That is, for example, in the door key 241, the skin sensor 1 is provided at the location to be contacted by the finger or the like of the person in a case where the lockup or unlock of the key for the hallway is carried out.

In a case where the skin sensor 1 determines that the finger or the like of the person is in contact with the location to be contacted by the finger or the like of the person, the door key 241 can be rotated for performing the lockup or unlock of the key for the hallway.

Therefore, as the door key 241 cannot be rotated by an object except for the finger or the like of the person, it is possible to prevent so-called thumbturn rotation in which a special tool is inserted from an outside of the hallway to illegally rotate the door key 241 for the unlock.

It should be noted that the door key 241 can also be used for a key for a window in addition to the use with regard to the key for the hallway.

Incidentally, according to the first embodiment, on the basis of the PD 23 provided to the skin sensor 1, the intensity of the reflected light is detected, and on the basis of the detection result, the skin sensor 1 is caused to determine whether or not the proximal object is the human skin, but for example, instead of the PD 23, by using a camera having about the same size as the PD 23, it is possible to set a configuration of determining whether or not the proximal object is the human skin.

5. Fifth Embodiment

[Configuration Example of Skin Sensor in Case of Using Camera]

Figure 14:
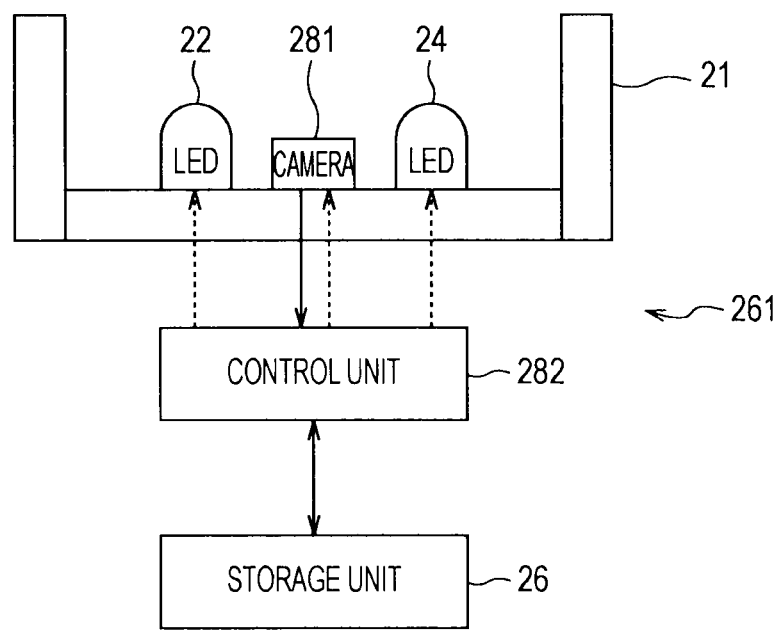
FIG. 14 is a block diagram illustrating a configuration example of a skin sensor according to a fifth embodiment.

FIG. 14 illustrates a configuration example of a skin sensor 261 according to a fifth embodiment.

It should be noted that in this skin sensor 261, parts configured in a similar manner to the skin sensor 1 according to the first embodiment are assigned with the same reference signs, and a description thereof will be appropriately omitted below.

That is, the skin sensor 261 is configured in a similar manner to the skin sensor 1 according to the first embodiment except for that a camera 281 and a control unit 282 are provided instead of the PD 23 and the control unit 25.

The camera 281 is, for example, a small-size camera having about the same size as the PD 23, receives the reflected light of the light of the first wavelength which is irradiated by the LED 22, and supplies a first picked up image obtained as the result to the control unit 282.

Also, the camera 281 receives the reflected light of the light of the second wavelength which is irradiated by the LED 24 and supplies a second picked up image obtained as the result to the control unit 282.

It should be noted that in the skin sensor 261, in a case where the light emitted from the LED 22 and the light emitted from the LED 24 are reflected by a mirror surface or the like that reflects either light at a same reflection factor, the light emission of the LED 22 and the LED 24 is set to be controlled so that the mutual pixel values of the corresponding pixels in the first and second picked up images obtained by the camera 281 become identical to each other.

The control unit 282 performs the detection on the human skin on the basis of the first and second picked up images from the camera 281. It should be noted that the detection on the human skin performed by the control unit 282 will be described below with reference to FIG. 15.

Then, in a case where it is possible to detect a skin area representing a part of the human skin with a size larger than or equal to a predetermined size (a size at which it is determined that the human skin is proximate) from the first picked up image (or the second picked up image) supplied from the camera 281, for example, as it is determined that the human skin comes close to the skin sensor 261, the control unit 282 performs a corresponding processing.

Also, the control unit 282 sets an operation mode of the skin sensor 261 and controls the LED 22, the LED 24, and the camera 281 so that the processing corresponding to the set operation mode is carried out. It should be noted that a detail of the operation mode will be described below with reference to FIG. 16.

[Detection Method for Skin by Control Unit 282]

Figure 15:
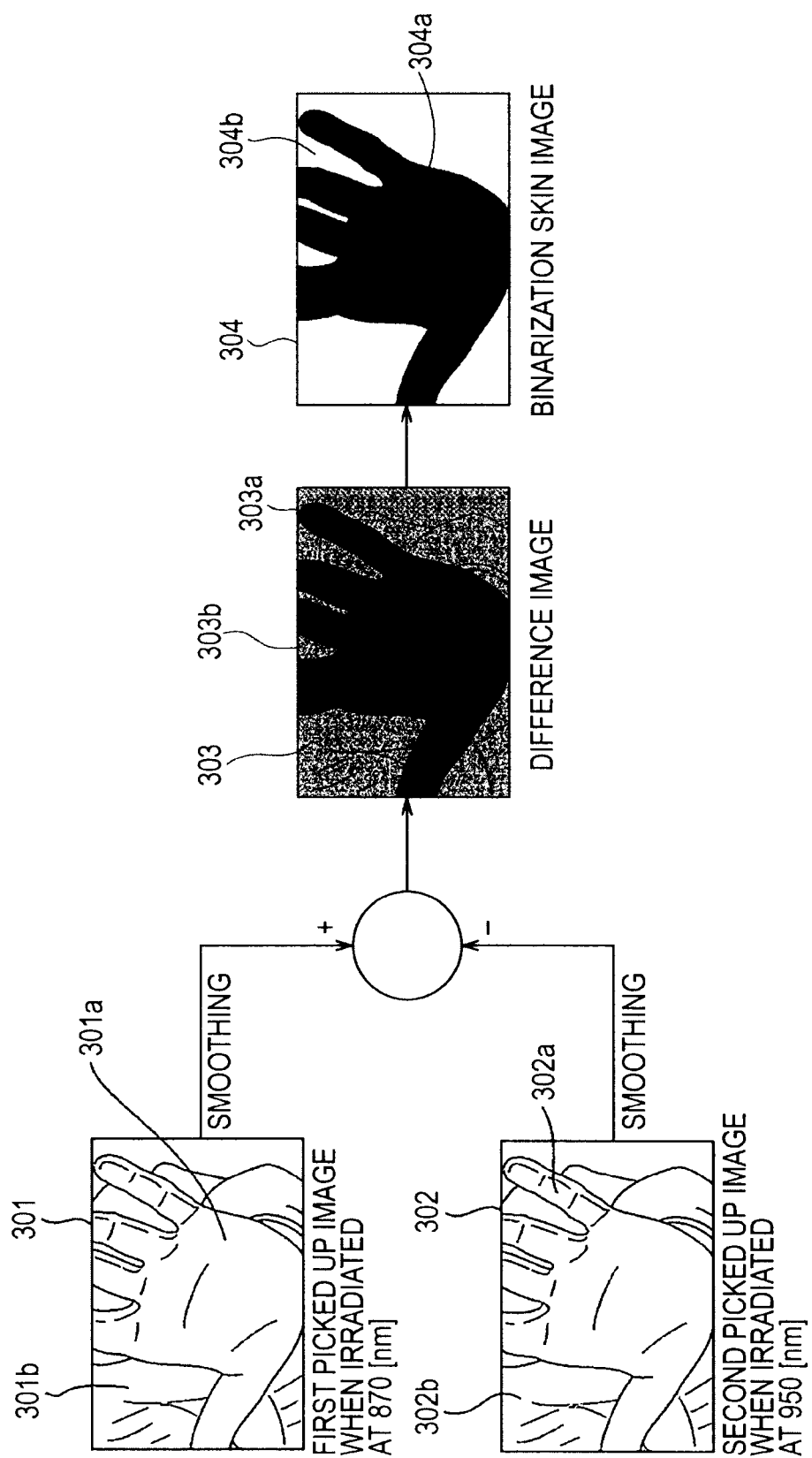
FIG. 15 is a drawing for describing a detail of a detection method for a skin.

Next, FIG. 15 illustrates a detail of a detection method for a skin which is performed by the control unit 282.

For example, the control unit 282 is supplied with a first picked up image 301 composed of a skin area 301a representing a human skin part and a non-skin area 301b (an area except for the skin area 301a) as well as a second picked up image 302 composed of a skin area 302a and a non-skin area 302b (an area except for the skin area 302a) from the camera 281.

The control unit 282 performs smoothing with use of LPF (low pass filter) on the first picked up image 301 and the second picked up image 302 supplied from the camera 281. Then, the control unit 282 calculates a difference absolute value of mutual luminance values of corresponding pixels in the first picked up image 301 after the smoothing and the second picked up image 302 after the smoothing and generates a difference image 303 having the difference absolute value as a pixel value.

The control unit 282 performs binarization on the generated difference image 303 in which among the pixel values of the pixels constituting the difference image 303, a pixel value larger than or equal to a binarization threshold used for the binarization is set as 1 and a pixel value smaller than the binarization threshold is set as 0.

Now, a skin area 303a in the difference image 303 is composed of a pixel having the difference absolute value between the skin area 301a and the skin area 302a as a pixel value. Therefore, the pixel value of the pixel constituting the skin area 303a has a relatively large value in accordance with a difference between a reflection factor of the light of the first wavelength with respect to the human skin and a reflection factor of the light of the second wavelength with respect to the human skin.

Also, a non-skin area 303b in the difference image 303 is composed of a pixel having the difference absolute value between the non-skin area 301b and the non-skin area 302b as a pixel value. Therefore, the pixel value of the pixel constituting the non-skin area 303b has a relatively small value in accordance with a difference between a reflection factor of the light of the first wavelength with respect to an object except for the human skin and a reflection factor of the light of the second wavelength with respect to an object except for the human skin.

Therefore, the difference image 303 is transformed into a binary skin image 304 composed of a skin area 304a in which a pixel value of the pixel constituting the skin area 303a is set as 1 and a non-skin area 304b in which a pixel value of the pixel constituting the non-skin area 303b is set as 0 through the binarization performed by the control unit 282.

Then, for example, in a case where it is determined that the skin area 304a having a size larger than or equal to a predetermined size (a size at which it is determined that the human skin is proximate) exists on the binary skin image 304 obtained through the binarization, the control unit 282 determines that the skin sensor 261 comes close to the human skin and executes a corresponding predetermined processing.

It should be noted that in a case where it is determined that the skin area 304a having the size larger than or equal to the predetermined size does not exist on the binary skin image 304 obtained through the binarization, the control unit 282 determines that the human skin does not come close to the skin sensor 261.

[Example of Transition of Operation Modes]

Figure 16:
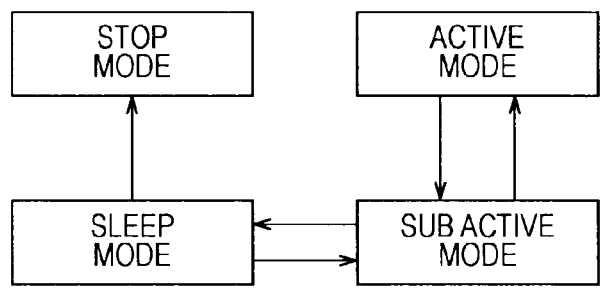
FIG. 16 illustrates an example of a transition of operation modes.

Next, FIG. 16 illustrates an example of a transition of operation modes in the skin sensor 261.

The skin sensor 261 is set as one operation mode of an active mode, a sub active mode, a sleep mode, and a stop mode, for example, as illustrated in FIG. 16.

That is, for example, the control unit 282 is set to store mode information representing the operation mode of the skin sensor 261 in the storage unit 26. Then, the control unit 282 determines the operation mode of the skin sensor 261 and controls the LED 22, the LED 24, and the camera 281 on the basis of the operation mode stored in the storage unit 26 so that a processing in accordance with the determined operation mode is carried out.

To be specific, for example, in accordance with turning on of the power source of the skin sensor 261, the control unit 282 updates the mode information stored in the storage unit 26 to the mode information representing the active mode and shifts the operation mode of the skin sensor 261 from the stop mode to the active mode.

It should be noted that for example, the storage unit 26 is set to previously store the mode information representing the stop mode.

The control unit 282 reads out the mode information stored in the storage unit 26 from the storage unit 26 and determines the operation mode of the skin sensor 261 on the basis of the read mode information.

Figure 17:
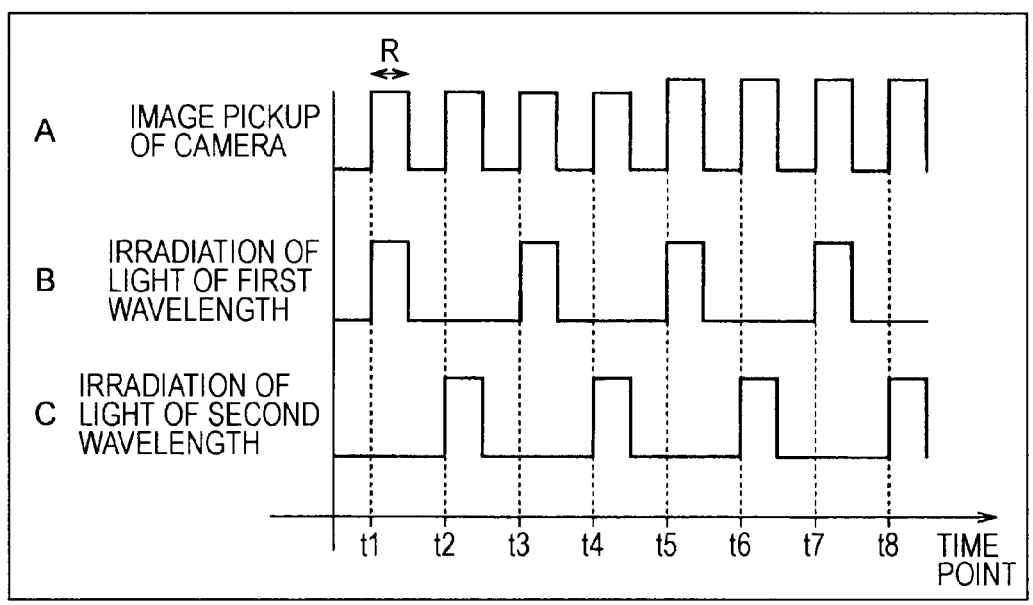
FIG. 17 illustrates an example of a mutual light emission skin detection processing for a camera which is carried out in the case of an active mode.

Then, in a case where it is determined that the operation mode of the skin sensor 261 is the active mode on the basis of the read mode information, the control unit 282 performs a mutual light emission skin detection processing for a camera at an image pickup timing and a light emission timing illustrated in FIG. 17.

Next, FIG. 17 illustrates an example of the mutual light emission skin detection processing for the camera which is carried out by the skin sensor 261 in a case where the operation mode is the active mode.

A of FIG. 17 illustrates a VD (vertical synchronization) signal representing an image pickup timing of the camera 281. B of FIG. 17 illustrates a light emission signal representing a light emission timing of the LED 22. C of FIG. 17 illustrates a light emission signal representing a light emission timing of the LED 24.

It should be noted that the horizontal axis of A of FIG. 17 to C of FIG. 17 represents a time point. These matters are similar to FIG. 18 and FIG. 19 that will be described below too.

In a case where the mode information read out from the storage unit 26 represents the active mode, the control unit 282 controls and causes the camera 281 to perform the image pickup for an exposure time (image pickup time) R from image pickup timings (image pickup start time points) t1, t2, t3, . . . illustrated in A of FIG. 17.

It should be noted that in A of FIG. 17, for example, the control unit 282 controls and causes the camera 281 to perform the image pickup in a cycle from 30 [fps] to 60 [fps].

Also, the control unit 282 controls and causes the LED 22 to emit the light of the first wavelength at the light emission timings (light emission start time points) t1, t3, t5, t7, . . . illustrated in B of FIG. 17 for a light emission time R (=exposure time R) and also emit the light of the second wavelength at the light emission timings t2, t4, t6, t8, . . . illustrated in C of FIG. 17 for the light emission time R.

In this case, for example, in the exposure time R from the time point t1, the LED 22 emits the light of the first wavelength, and the camera 281 receives the reflected light from the subject irradiated with the light from the LED 22 and supplies the first picked up image 301 obtained through the light reception to the control unit 282. It should be noted that also in the exposure time R respectively from the time points t3, t5, t7, . . . , a similar processing is carried out.

Also, for example, in the exposure time R from the time point t2, the LED 24 emits the light of the second wavelength, and the camera 281 receives the reflected light from the subject irradiated with the light from the LED 24 and supplies the second picked up image 302 obtained through the light reception to the control unit 282. It should be noted that also in the exposure time R respectively from the time points t2, t4, t6, . . . , a similar processing is carried out.

Each time the first picked up image 301 and the second picked up image 302 are supplied from the camera 281, the control unit 282 performs the detection for the skin on the basis of the first picked up image 301 and the second picked up image 302.

Then, in a case where the skin cannot be detected within a restriction time T1 (for example, 1 minute) which is previously stored in the storage unit 26, the control unit 282 updates the mode information stored in the storage unit 26 to the mode information representing the sub active mode and shifts the operation mode of the skin sensor 261 from the active mode to the sub active mode.

It should be noted that the restriction time T1 is set as a time during which the detection for the skin can be attempted by the number of times previously decided in the active mode, for example. In this case, when the control unit 282 attempts the detection for the skin and cannot detect the skin within the previously decided number of times, the operation mode of the skin sensor 261 is shifted from the active mode to the sub active mode.

This similarly applies to the mutual light emission skin detection processing for the camera carried out in a case where the operation mode of the skin sensor 261 is the sub active mode.

Figure 18:
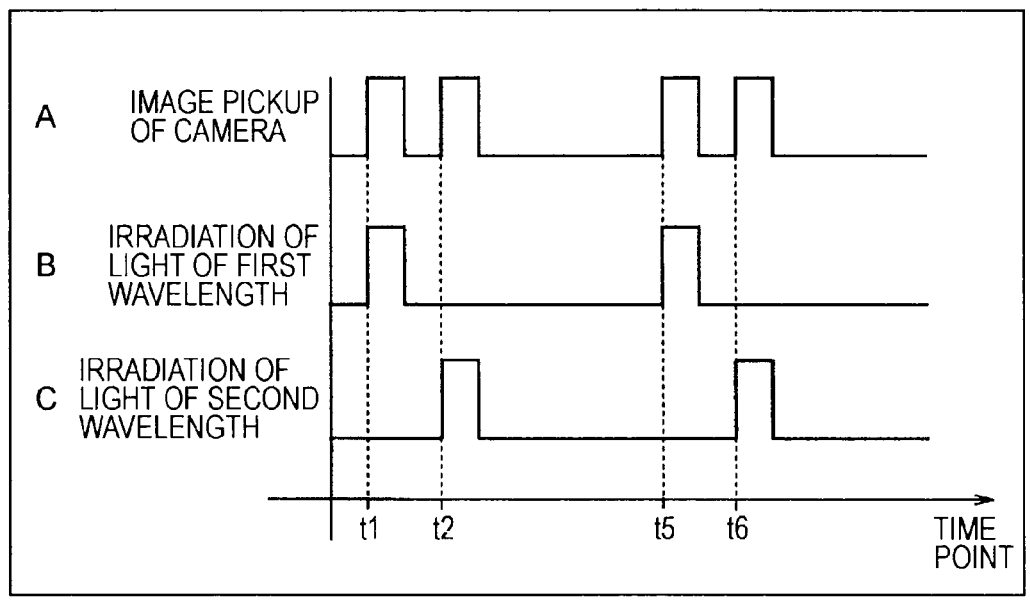
FIG. 18 illustrates an example of the mutual light emission skin detection processing for the camera which is carried out in the case of a sub active mode.

Also, in a case where the mode information read out from the storage unit 26 represents the sub active mode, the control unit 282 performs the mutual light emission skin detection processing for the camera at the image pickup timings and the light emission timings illustrated in FIG. 18.

Next, FIG. 18 illustrates an example of the mutual light emission skin detection processing for the camera carried out by the skin sensor 261 in a case where the operation mode is the sub active mode.

In a case where in a case where the mode information read out from the storage unit 26 represents the sub active mode, the control unit 282 controls and causes the camera 281 to perform the image pickup only in the exposure time R from the image pickup timings (image pickup start time points) t1, t2, t5, t6, . . . illustrated in A of FIG. 18.

It should be noted that in A of FIG. 18, for example, the control unit 282 controls and causes the camera 281 to perform the image pickup in a cycle from 10 [fps] to 20 [fps] which is longer than the cycle for the image pickup in A of FIG. 17 (cycle from 30 [fps] to 60 [fps]).

Also, the control unit 282 controls and causes the LED 22 to emit the light of the first wavelength for the light emission time R at the light emission timings (light emission start time points) t1, t5, . . . illustrated in B of FIG. 18 and emit the light of the second wavelength for the light emission time R at the light emission timings t2, t6, . . . illustrated in C of FIG. 18.

Then, in the camera 281, similarly as in the case of the active mode, the image pickup of the first picked up image 301 and the second picked up image 302 is carried out to be supplied to the control unit 282. In the control unit 282, similarly as in the case of the active mode, on the basis of the first picked up image 301 and the second picked up image 302 from the camera 281, the detection for the skin is carried out.

Also, in a case where the skin cannot be detected within a restriction time T2 (for example, 3 minutes) which is previously stored in the storage unit 26, the control unit 282 updates the mode information stored in the storage unit 26 to the mode information representing the sleep mode and shifts the operation mode of the skin sensor 261 from the sub active mode to the sleep mode.

Figure 19:
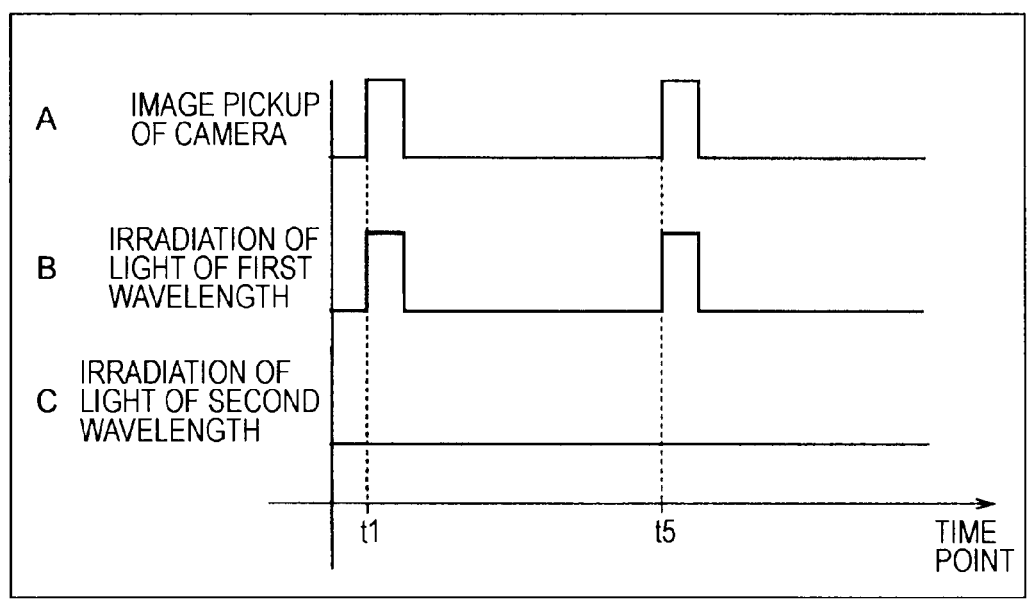
FIG. 19 illustrates an example of a motion determination processing carried out by a skin sensor 261 in the case of a sleep mode.

Next, FIG. 19 illustrates an example of the motion determination processing performed by the skin sensor 261 in a case where the operation mode is the sleep mode.

In a case where the mode information read out from the storage unit 26 represents the sleep mode, the control unit 282 controls and causes the camera 281 to perform the image pickup for the exposure time R from the image pickup timings (image pickup start time points) t1, t5, . . . illustrated in A of FIG. 19.

Also, the control unit 282 controls and causes the LED 22 to emit the light of the first wavelength for the light emission time R at the light emission timings (light emission start time points) t1, t5, . . . illustrated in B of FIG. 19.

It should be noted that in a case where the operation mode is the sleep mode, the control unit 282 controls and causes the LED 24 not to emit the light as illustrated in C of FIG. 19.

In this case, for example, in the exposure time R from the time point t1, the LED 22 emits the light of the first wavelength, and the camera 281 receives the reflected light from the subject irradiated with the light from the LED 22 and supplies the first picked up image 301 obtained through the light reception to the control unit 282 as a first image for a determination.

Also, for example, in the exposure time R from the time point t5, the LED 22 emits the light of the first wavelength, and the camera 281 receives the reflected light from the subject irradiated with the light from the LED 22 and supplies the first picked up image 301 obtained through the light reception to the control unit 282 as a second image for a determination.

The control unit 282 performs a motion determination processing of determining whether or not a object in motion exists within the image pickup range of the camera 281 (whether or not a object in motion exists on the first or second image for the determination) on the basis of the first and second images for the determination from the camera 281. It should be noted that a detail of the motion determination processing will be described below with reference to a flow chart of FIG. 23.

Also, in the motion determination processing, in a case where the determination result that the object in motion exists cannot be obtained within a restriction time T3 (for example, 10 minutes) which is previously stored in the storage unit 26, the control unit 282 updates the mode information stored in the storage unit 26 to the mode information representing the stop mode and shifts the operation mode of the skin sensor 261 from the sleep mode to the stop mode.

In this case, the control unit 282 determines that a probability that the user forgets to shut off the power source of the skin sensor 261 is high, and in accordance with the transition of the operation mode of the skin sensor 261 to the stop mode, the power source of the skin sensor 261 is completely turned off (shut).

It should be noted that in a case where the power source of the skin sensor 261 is turned on, the control unit 282 updates the mode information stored in the storage unit 26 to the mode information representing the active mode and shifts the operation mode of the skin sensor 261 from the stop mode to the active mode.

Also, the control unit 282 can set the skin sensor 261 in a so-called sleep state (state in which it is possible to immediately return through an operation of the user) instead of completely turning off the power source of the skin sensor 261. In this case, as compared with the case in which the power source of the skin sensor 261 is completely turned off, the transition from the stop mode to another mode can be made more promptly.

[Description on Mode Transition Processing]

Next, a mode transition processing performed by the skin sensor 261 will be described below with reference to flow charts of FIG. 20 and FIG. 21.

It should be noted that this mode transition processing is started, for example, when the power source of the skin sensor 261 is turned on.

At this time, in step S61, in accordance with turning on of the power source of the skin sensor 261, the control unit 282 updates the mode information stored in the storage unit 26 to the mode information representing the active mode and shifts the operation mode of the skin sensor 261 to the active mode.

In step S62, the control unit 282 determines the operation mode of the skin sensor 261 on the basis of the operation mode stored in the storage unit 26.

In the current case, the operation mode of the skin sensor 261 is set as the active mode. For this reason, on the basis of the operation mode stored in the storage unit 26, the control unit 282 determines that the operation mode of the skin sensor 261 is the active mode. Then, the control unit 282 sets the image pickup timing of the camera 281 as well as the light emission timings of the LED 22 and the LED 24 as the image pickup timings and the light emission timings corresponding to the active mode (FIG. 17).

In step S63, the control unit 282 starts timekeeping for the time. In step S64, the control unit 282 determines whether or not the timekeeping time obtained through the timekeeping passes the restriction time T1 previously stored in the storage unit 26.

Then, in a case where it is determined that the timekeeping time does not pass the restriction time T1, the control unit 282 advances the process to step S65.

In step S65, the mutual light emission skin detection processing for the camera is carried out in which at the image pickup timings and the light emission timings illustrated in FIG. 17, the camera 281 as well as the LED 22 and the LED 124 are controlled, the LED 22 and the LED 24 are caused to mutually emit the light, and the human skin is detected on the basis of the first and second picked up images obtained through the image pickup of the camera 281.

It should be noted that a detail of the mutual light emission skin detection processing for the camera will be described below with reference to a flow chart of FIG. 22.

In step S66, on the basis of the detection result by the mutual light emission skin detection processing for the camera in step S65, it is determined whether or not a skin area having a size larger than or equal to a predetermined size is detected from the first picked up image (or the second picked up image, and in a case where it is determined that the skin area having the size larger than or equal to the predetermined size is not detected, the control unit 282 returns the processing to step S64, and thereafter, a similar processing is carried out.

Also, in step S66, on the basis of the detection result by the mutual light emission skin detection processing for the camera in step S65, in a case where it is determined that the skin area having the size larger than or equal to the predetermined size is detected, the control unit 282 advances the processing to step S67.

In step S67, the control unit 282 returns the timekeeping time during the timekeeping to 0 and returns the processing to step S63. Then, in step S63, the control unit 282 starts the timekeeping from 0, and thereafter, a similar processing is carried out.

Also, in step S64, in a case where it is determined that the timekeeping time passes the time T1, the control unit 282 advances the processing to step S68. In step S68, the control unit 282 updates the mode information stored in the storage unit 26 to the mode information representing the sub active mode and shifts the operation mode of the skin sensor 261 from the active mode to the sub active mode.

In step S69, the control unit 282 determines the operation mode of the skin sensor 261 on the basis of the operation mode stored in the storage unit 26.

In the current case, the operation mode of the skin sensor 261 is set as the sub active mode. For this reason, the control unit 282 determines that the operation mode of the skin sensor 261 is the active mode on the basis of the operation mode stored in the storage unit 26. Then, the control unit 282 sets the image pickup timing of the camera 281 as well as the light emission timings of the LED 22 and the LED 24 as the image pickup timings and the light emission timings corresponding to the sub active mode (FIG. 18).

In step S70, the control unit 282 returns the timekeeping time during the timekeeping to 0 from the processing in step S63 and starts the timekeeping from 0. In step S71, the control unit 282 determines whether or not the timekeeping time obtained through the timekeeping passes the restriction time T2 previously stored in the storage unit 26.

Then, in a case where it is determined that the timekeeping time does not pass the restriction time T2, the control unit 282 advances the processing to step S72. In step S72, at the image pickup timings and the light emission timings illustrated in FIG. 18, the control unit 282 controls the camera 281 as well as the LED 22 and the LED 24 and performs the mutual light emission skin detection processing for the camera that will be described in FIG. 22 below.

In step S73, it is determined whether or not the skin area having the size larger than or equal to the predetermined size is detected from the first picked up image (or the second picked up image) on the basis of the detection result through the mutual light emission skin detection processing for the camera in step S72, and in a case where it is determined that the skin area having the size larger than or equal to the predetermined size is not detected, the control unit 282 returns the processing to step S71, and thereafter, a similar processing is carried out.

Also, in step S73, on the basis of the detection result through the mutual light emission skin detection processing for the camera in step S72, in a case where it is determined that the skin area having the size larger than or equal to the predetermined size is detected, the control unit 282 returns the processing to step S61.

Then, in step S61, the control unit 282 updates the mode information stored in the storage unit 26 to the mode information representing the active mode and shifts the operation mode of the skin sensor 261 and performs the transition from the sub active mode to the active mode, and thereafter, a similar processing is carried out.

Figure 21:
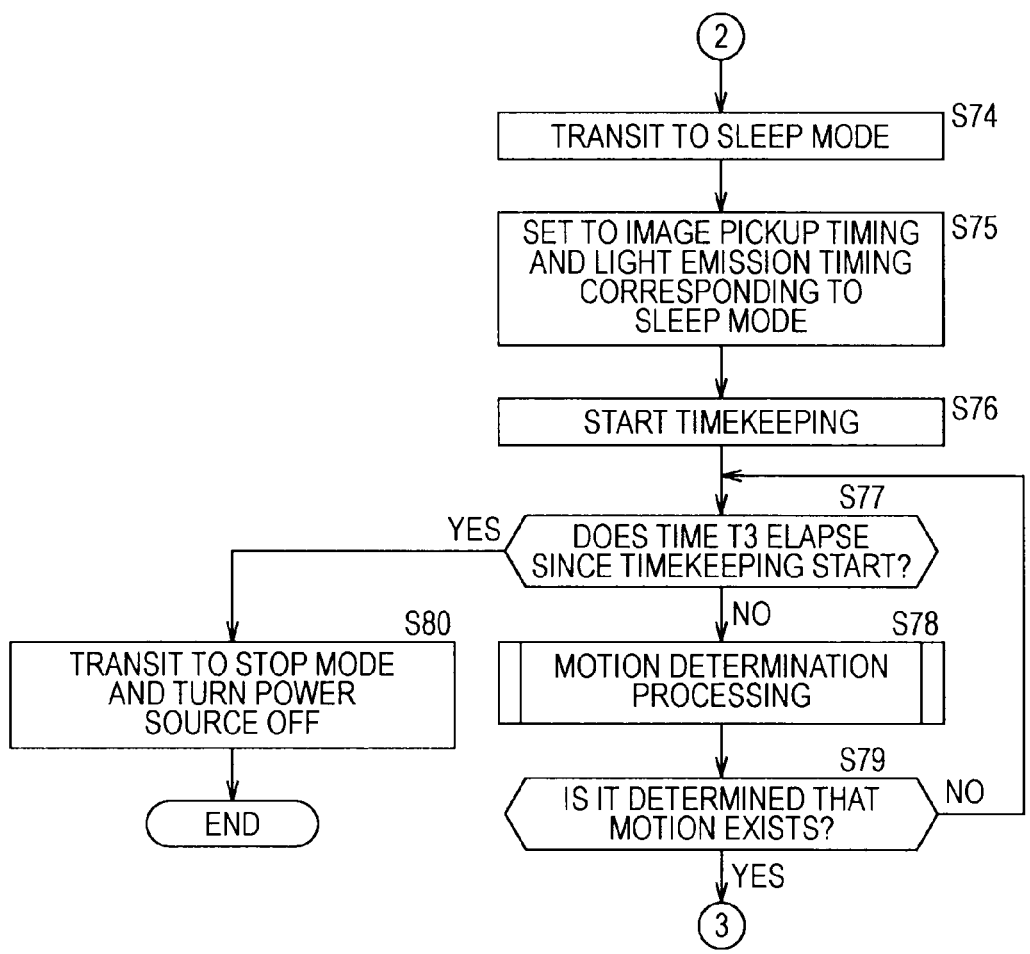
FIG. 21 is a second flow chart for describing the mode transition processing.

Also, in step S71, in a case where it is determined that the timekeeping time passes the restriction time T2, the control unit 282 advances the processing to step S74 of FIG. 21.

In step S74, the control unit 282 updates the mode information stored in the storage unit 26 to the mode information representing the sleep mode and shifts the operation mode of the skin sensor 261 from the sub active mode to the sleep mode.

In step S75, the control unit 282 determines the operation mode of the skin sensor 261 on the basis of the operation mode stored in the storage unit 26.

In the current case, the operation mode of the skin sensor 261 is set as the sleep mode. For this reason, the control unit 282 determines that the operation mode of the skin sensor 261 is the sleep mode on the basis of the operation mode stored in the storage unit 26. Then, the control unit 282 sets the image pickup timing of the camera 281 as well as the light emission timings of the LED 22 and the LED 24 as the image pickup timings and the light emission timings corresponding to the sleep mode (FIG. 19).

In step S76, the control unit 282 returns the timekeeping time during the timekeeping to 0 from the processing in step S70 and starts the timekeeping from 0. In step S77, the control unit 282 determines whether or not the timekeeping time obtained through the timekeeping passes the restriction time T3 previously stored in the storage unit 26.

Then, in a case where it is determined that the timekeeping time does not pass the restriction time T3, the control unit 282 advances the processing to step S78.

In step S78, at the image pickup timings and the light emission timings illustrated in FIG. 19, the control unit 282 controls the camera 281 as well as the LED 22 and the LED 24 and performs the motion determination processing of determining whether or not a object in motion exists within the image pickup range of the camera 281. It should be noted that a detail of the motion determination processing will be described below with reference to the flow chart of FIG. 23.

In step S79, in a case where the determination result through the motion determination processing in step S78 is the determination result that the object in motion does not exist within the image pickup range of the camera 281, the control unit 282 returns the processing to step S77, and thereafter, a similar processing is carried out.

Figure 20:
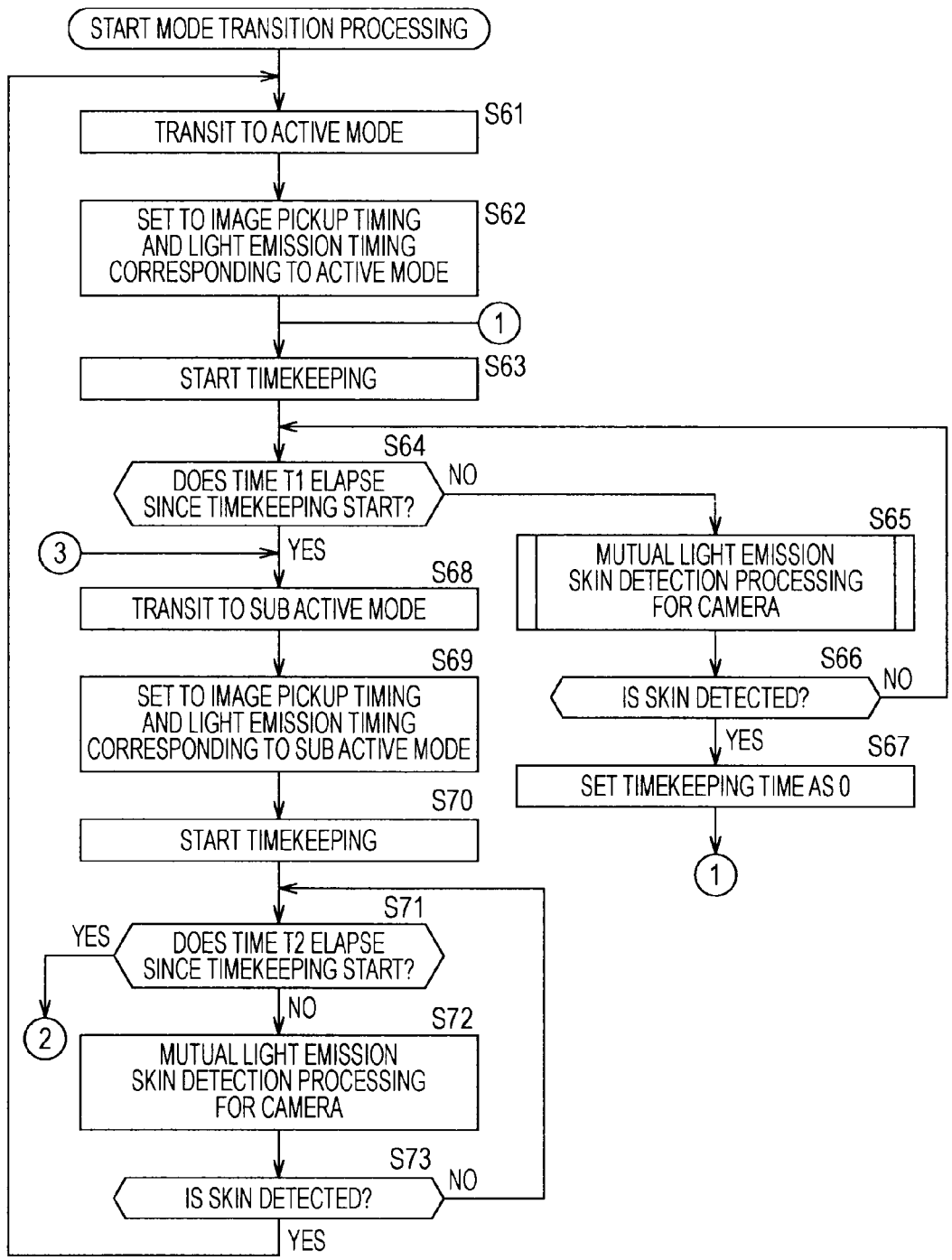
FIG. 20 is a first flow chart for describing a mode transition processing.

Also, in step S79, in a case where the determination result through the motion determination processing in step S78 is the determination result that the object in motion exists within the image pickup range of the camera 281, the control unit 282 returns the processing to step S68 of FIG. 20.

Then, in step S68, the control unit 282 updates the mode information stored in the storage unit 26 to the mode information representing the sub active mode and shifts the operation mode of the skin sensor 261 from the sleep mode to the sub active mode, and thereafter, a similar processing is carried out.

Also, in step S77, in a case where it is determined that the timekeeping time passes the restriction time T3, the control unit 282 advances the processing to step S80. In step S80, the control unit 282 updates the mode information stored in the storage unit 26 to the mode information representing the stop mode and shifts the operation mode of the skin sensor 261 from the sleep mode to the stop mode to completely turn off the power source of the skin sensor 261. With that, the mode transition processing is ended.

As described above, according to the mode transition processing, in accordance with a frequency in which the skin comes close to the skin sensor 261, the operation mode of the skin sensor 261 is set to be shifted so that the cycle for the image pickup performed by the camera 281 as well as the cycles for causing the LED 22 and the LED 24 to emit the light are changed.

Therefore, the operation mode of the skin sensor 261 is shifted so that the cycle for the image pickup performed by the camera 281 as well as the cycles for causing the LED 22 and the LED 24 to emit the light become longer as the frequency in which the skin comes close becomes smaller, for example, the power consumption can be suppressed as compared with the case in which the mutual light emission skin detection processing for the camera at the image pickup timings and the light emission timings illustrated in FIG. 17 is carried out.

Also, the operation mode of the skin sensor 261 is shifted so that the cycle for the image pickup performed by the camera 281 as well as the cycles for causing the LED 22 and the LED 24 to emit the light become shorter as the frequency in which the skin comes close becomes larger, while suppressing the power consumption, it is possible to precisely detect the proximate skin.

[Description on Mutual Light Emission Skin Detection Processing for Camera]

Next, a detail of the mutual light emission skin detection processing for the camera in step S65 of FIG. 20 which is carried out in a case where the operation mode of the skin sensor 261 is set as the active mode will be described with reference to the flow chart of FIG. 22.

It should be noted that the mutual light emission skin detection processing for the camera which is carried out in a case where the operation mode of the skin sensor 261 is the sub active mode (processing in step S72 of FIG. 20) is also carried out similarly as in the case in which the operation mode of the skin sensor 261 is set as the active mode.

Therefore, in FIG. 22, the mutual light emission skin detection processing for the camera in a case where the operation mode of the skin sensor 261 is set as the active mode will be described, and a description in a case where the operation mode of the skin sensor 261 is set as the sub active mode will be omitted.

In step S101, while following the control from the control unit 282, the LED 22 emits the light of the first wavelength for the light emission time R from light emission timings tn in accordance with the active mode (n=1, 3, 5, . . . ) (in the current case, for example, t1).

In step S102, the camera 281 picks up an image of the subject irradiated with the light of the first wavelength while following the control from the control unit 282, for the exposure time R from the image pickup timing tn that is identical to the light emission timings tn in accordance with the active mode.

Then, the camera 281 supplies the first picked up image 301 obtained through the image pickup to the control unit 282. In step S103, the control unit 282 holds the first picked up image 301 from the camera 281 in a built-in memory that is not illustrated in the drawing.

When the light emission time (exposure time) R elapses from the light emission timing (image pickup timing) tn, the process progresses to step S104, the LED 22 turns off while following the control from the control unit 282 and stops the light emission of the light of the first wavelength.

Also, the camera 281 stops the image pickup while following the control from the control unit 282.

In step S105, the LED 24 emits the light of the second wavelength while following the control from the control unit 282 for the light emission time R from light emission timing tm (m=2, 4, 6, . . . ) (in the current case, for example, t2) in accordance with the active mode.

In step S106, the camera 281 picks up an image of the subject irradiated with the light of the second wavelength while following the control from the control unit 282 for the exposure time R from the image pickup timing tm that is identical to the light emission timing tm in accordance with the active mode.

Then, the camera 281 supplies the second picked up image 302 obtained through the image pickup to the control unit 282. In step S107, the control unit 282 holds the second picked up image 302 from the camera 281 in the built-in memory that is not illustrated in the drawing.

When the light emission time (exposure time) R elapses from the light emission timing (image pickup timing) tm, the processing progresses to step S108, the LED 24 turns off while following the control from the control unit 282 and stops the light emission of the light of the second wavelength.

Also, the camera 281 stops the image pickup while following the control from the control unit 282.

In step S109, in the processing in step S103 and step S107, the control unit 282 attempts the detection for the skin on the basis of the first picked up image 301 and the second picked up image 302 held in a built-in memory as described with reference to FIG. 15.

In step S110, it is determined whether or not a skin area having a size larger than or equal to a predetermined size can be detected on the first picked up image 301 (or the second picked up image 302) on the basis of the processing result through the processing in step S109, and in a case where it is determined that the skin area having the size larger than or equal to the predetermined size can be detected, the control unit 282 advances the processing to step S111.

In step S111, the control unit 282 determines that the subject (object) picked up through the image pickup of the camera 281 is the human skin coming close to the skin sensor 261 and executes a corresponding predetermined processing.

Also, in step S110, in a case where it is determined that the skin area having the size larger than or equal to the predetermined size cannot be detected on the basis of the processing result through the processing in step S109, the control unit 282 ends the mutual light emission skin detection processing for the camera.

After the end of the mutual light emission skin detection processing for the camera, the processing is set to be returned to step S65 of FIG. 20 and advanced to step S66.

It should be noted that in the mode transition processing, in a case where the processing in step S64 to step S66 is repeatedly carried out, in the mutual light emission skin detection processing for the camera, the LED 22 emits the light at the light emission timing t1, the LED 24 emits the light at the light emission timing t2, and also the camera 281 performs the image pickup at the image pickup timings t1 and t2. Then, in the next mutual light emission skin detection processing for the camera, the LED 22 emits the light at the light emission timing t3, the LED 24 emits the light at the light emission timing t4, and also the camera 281 performs the image pickup at the image pickup timings t3 and t4.

[Description on Motion Determination Processing]

Figure 23:
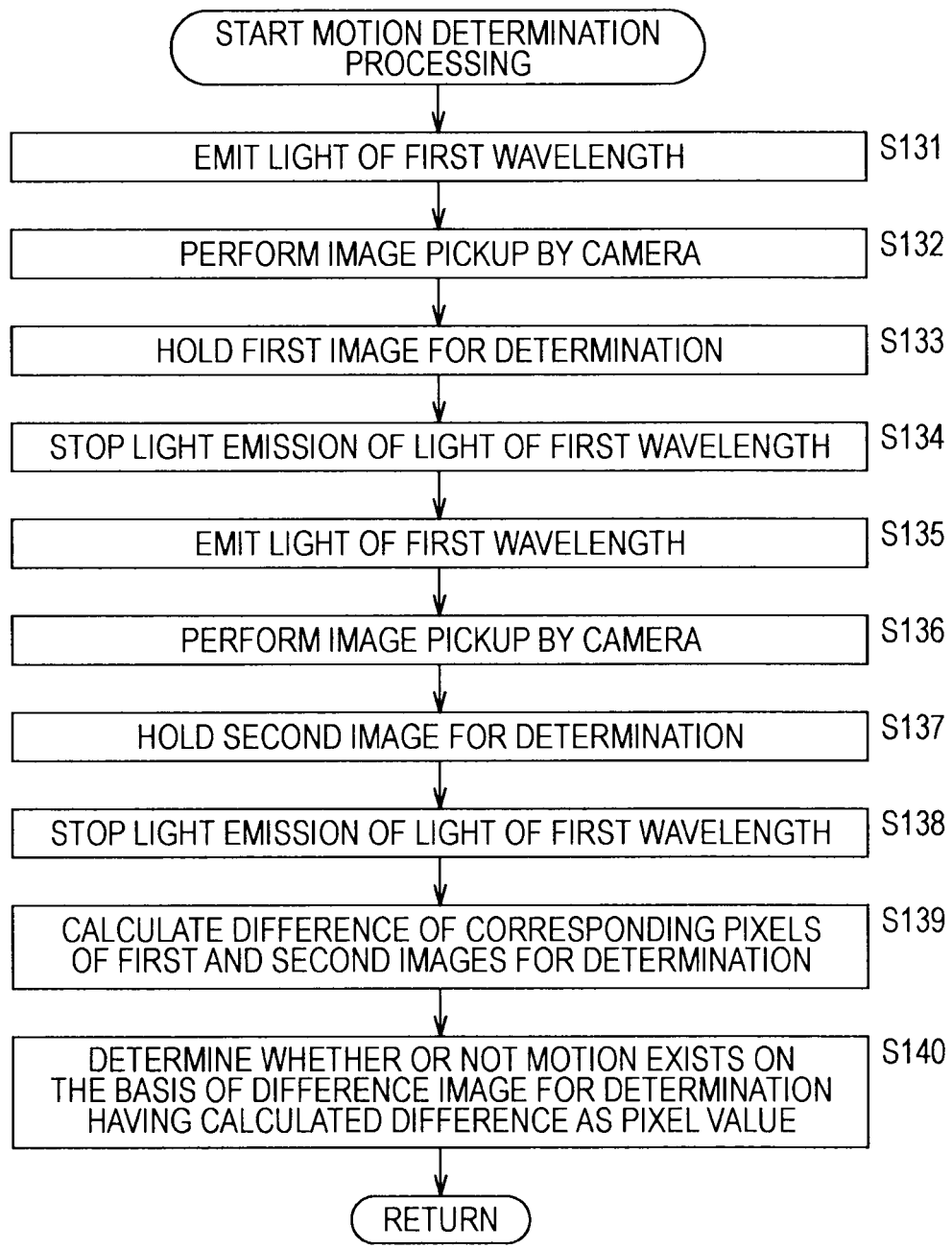
FIG. 23 is a flow chart for describing the motion determination processing.

Next, a detail of the motion determination processing carried out in step S78 of the mode transition processing will be described with reference to the flow chart of FIG. 23.

In step S131, the LED 22 emits the light of the first wavelength while following the control from the control unit 282 for the light emission time R from light emission timings tp (p=1, 5, . . . ) (for example, t1 in the current case) in accordance with the sleep mode which are set as the operation mode of the skin sensor 261.

In step S132, the camera 281 picks up an image of the subject irradiated with the light of the first wavelength while following the control from the control unit 282 for the exposure time R from the image pickup timing tp which are identical to the light emission timings tp in accordance with the sleep mode.

Then, the camera 281 supplies the picked up image obtained through the image pickup to the control unit 282 as the first image for the determination. In step S133, the control unit 282 holds the first image for the determination from the camera 281 in the built-in memory that is not illustrated in the drawing.

When the light emission time (exposure time) R elapses from the light emission timing (image pickup timing) tp (for example, t1 in the current case), the processing progresses to step S134, and the LED 22 turns off while following the control from the control unit 282 and stops the light emission of the light of the first wavelength. Also, the camera 281 stops the image pickup while following the control from the control unit 282.

In step S135, the LED 24 emits the light of the first wavelength while following the control from the control unit 282 for the light emission time R from the next light emission timing tp (for example, t5 in the current case) in accordance with the sleep mode.

In step S136, the camera 281 picks up an image of the subject irradiated with the light of the first wavelength while following the control from the control unit 282 for the exposure time R from the image pickup timing that is identical to the light emission timing tp in step S135.

Then, the camera 281 supplies the picked up image obtained through the image pickup to the control unit 282 as the second image for the determination. In step S137, the control unit 282 holds the second image for the determination from the camera 281 in the built-in memory that is not illustrated in the drawing.

When the light emission time R elapses from the light emission timing tp (for example, t5 in the current case), the process progresses to step S138, and the LED 22 turns off while following the control from the control unit 282 and stops the light emission of the light of the first wavelength. Also, the camera 281 stops the image pickup while following the control from the control unit 282.

In step S139, in the processing in step S133 and step S137, the control unit 282 calculates a difference absolute value of the mutual pixel values of the corresponding pixels in the first and second images for the determination held in the built-in memory and generates a difference image for a determination which is composed of respective pixels having the calculated difference absolute value as the pixel value.

In step S140, the control unit 282 determines whether or not the object in motion exists within the image pickup range of the camera 281 on the basis of the generated difference image for the determination.

That is, for example, the control unit 282 determines whether or not the object in motion exists within the image pickup range of the camera 281 on the basis of whether or not the motion area composed of pixels whose pixel value is larger than or equal to the predetermined threshold among the respective pixels constituting the generated difference image for the determination. With that, the motion determination processing is ended, the processing is returned to step S78 of FIG. 21, and the process proceeds to step S79.

It should be noted that in the mode transition processing, in a case where step S77 to step S79 are repeatedly carried out, in the motion determination processing, the LED 22 emits the light at the light emission timings t1 and t5, and the camera 281 performs the image pickup at the image pickup timings t1 and t5. Then, in the next motion determination processing, the LED 22 emits the light at the light emission timings t9 and t13, and the camera 281 performs the image pickup at the image pickup timings t9 and t13.

As described above, in the motion determination processing, as the LED 22 that emits the light of the first wavelength shorter than the second wavelength is caused to emit the light, and the camera 281 is caused to generate the first and second images for the determination, it is possible to carry out the motion determination processing while further saving the power as compared with the case in which the LED 24 that emits the light of the second wavelength is caused to emit the light.

That is, as a light reception sensitivity characteristic of the camera 281, it is generally known that as the light has a shorter wavelength, the reception sensitivity of the camera 281 is higher.

Therefore, in a case where the LED 22 is caused to emit the light, in order to generate the identical first and second images for the determination to the case in which the LED 24 is caused to emit the light, light at an intensity smaller than the intensity of the light emitted from the LED 24 may be emitted, and it is possible to carry out the motion determination processing while further saving the power.

It should be noted that in the motion determination processing, only the LED 22 is caused to emit the light, but by causing only the LED 24 to emit the light instead of the LED 22, each second picked up image obtained from the camera 281 may also be set as the first and second images for the determination to carry out the motion determination processing.

6. Sixth Embodiment

[Another Configuration Example of Skin Sensor Using Camera]

Figure 24:
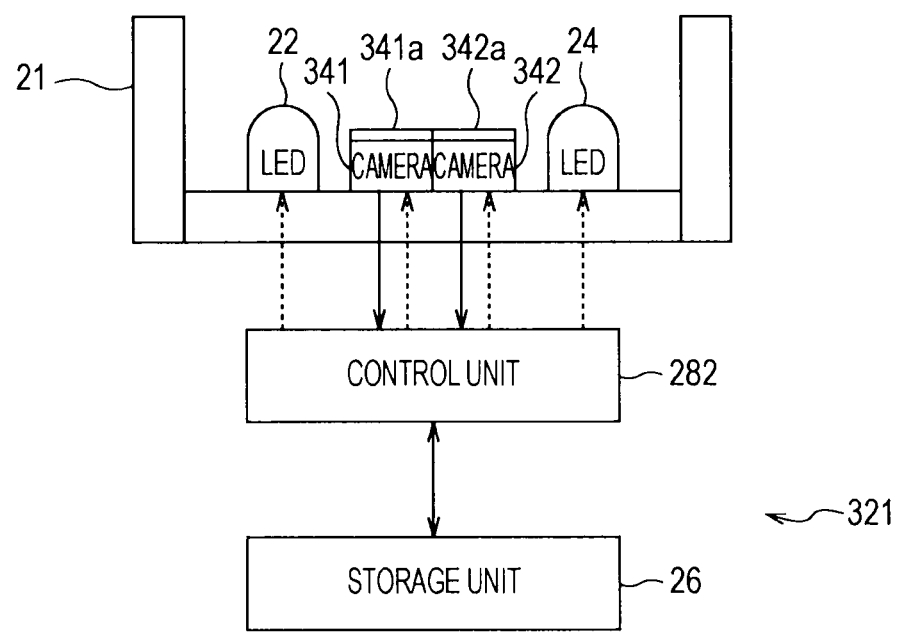
FIG. 24 is a block diagram illustrating a configuration example of a skin sensor according to a sixth embodiment.

FIG. 24 illustrates a configuration example of a skin sensor 321 according to a sixth embodiment.

It should be noted that in this skin sensor 321, parts configured in a similar manner to the skin sensor 1 according to the first embodiment are assigned with the same reference signs, and a description thereof will be appropriately omitted below.

That is, the skin sensor 321 is similarly composed as in the skin sensor 1 according to the first embodiment except that cameras 341 and 342 are provided instead of the PD 23.

The camera 341 has a lens surface thereof (lens surface that receives reflected light) covered with a spectral filter 341a.

The spectral filter 341a is a band-pass filter that only transmits the first wavelength (for example, 870 [nm]).

That is, the spectral filter 341a transmits only the reflected light of the light emitted by the LED 22 among the reflected light of the light emitted by the LED 22 and the reflected light of the light that is emitted by the LED 24 to be received by the lens surface of the camera 341.

The camera 341 receives the reflected light of the light emitted by the LED 22 transmitted through the spectral filter 341a. Then, the camera 341 generates the first picked up image 301 on the basis of the received reflected light to be supplied to the control unit 282.

The camera 342 has a lens surface thereof covered with the spectral filter 342a.

The spectral filter 342a is a band-pass filter that only transmits the second wavelength (for example, 950 [nm]) which is different from the first wavelength.

That is, the spectral filter 342a transmits only the reflected light of the light that is emitted by the LED 24 among the reflected light of the light emitted by the LED 22 and the reflected light of the light that is emitted by the LED 24 to be received by the lens surface of the camera 342.

The camera 342 receives the reflected light of the light that is emitted by the LED 24 transmitted through the spectral filter 342a. Then, the camera 342 generates the second picked up image 302 on the basis of the received reflected light to be supplied to the control unit 282.

It should be noted that the skin sensor 321 performs the mode transition processing similar to the skin sensor 261.

However, the skin sensor 321 is different in that a simultaneous light emission skin detection processing for a camera is carried out instead of the mutual light emission skin detection processing for the camera (step S65 and step S72) which is carried out in the mode transition processing.

[Description on Simultaneous Light Emission Skin Detection Processing for Camera]

Next, a detail of the simultaneous light emission skin detection processing for the camera which is carried out in a case where the operation mode of the skin sensor 321 is set as the active mode will be described with reference to the flow chart of FIG. 25.

It should be noted that the simultaneous light emission skin detection processing for the camera carried out in a case where the operation mode of the skin sensor 321 is set as the sub active mode is carried out similarly as in a case where the operation mode of the skin sensor 321 is set as the active mode, a description thereof will be omitted.

In step S161, the LED 22 emits the light of the first wavelength while following the control from the control unit 282 for the light emission time R from the light emission timing tq (q=1, 3, 5, . . . ) (in the current case, for example, t1) in accordance with the active mode.

In step S162, the LED 24 emits the light of the second wavelength while following the control from the control unit 282 for the light emission time R from the light emission timing tq (in the current case, for example, t1) in accordance with the active mode.

According to this, both the LED 22 and the LED 24 emit the lights, and the camera 341 and the camera 342 are irradiated with the reflected light of the light emitted by the LED 22 and the reflected light of the light emitted by the LED 24.

In step S163, the camera 341 performs the image pickup while following the control from the control unit 282 for the exposure time R from the image pickup timing tq that is identical to the light emission timing tq in accordance with the active mode.

According to this, the camera 341 receives only the reflected light of the light emitted by the LED 22 which is transmitted through the spectral filter 341a among the reflected light of the light emitted by the LED 22 and the reflected light of the light emitted by the LED 24. Then, the camera 341 generates the first picked up image 301 on the basis of the received reflected light to be supplied to the control unit 282.

In step S164, the control unit 282 holds the first picked up image 301 from the camera 341 in the built-in memory.

In step S165, the camera 342 performs the image pickup while following the control from the control unit 282 for the exposure time R from the image pickup timing tq that is identical to the light emission timing tq in accordance with the active mode.

According to this, the camera 342 receives only the reflected light of the light emitted by the LED 24 that is transmitted through the spectral filter 342a among the reflected light of the light emitted by the LED 22 and the reflected light of the light emitted by the LED 24. Then, the camera 342 generates the second picked up image 302 on the basis of the received reflected light to be supplied to the control unit 282.

In step S166, the control unit 282 holds the second picked up image 302 from the camera 342 in the built-in memory.

When the light emission time (exposure time) R elapses from the light emission timing (image pickup timing) tq, the processing progresses to step S167, and the LED 22 turns off while following the control from the control unit 282 and stops the light emission of the light of the first wavelength. Also, the camera 341 stops the image pickup while following the control from the control unit 282.

In step S168, the LED 24 turns off while following the control from the control unit 282 and stops the light emission of the light of the second wavelength. Also, the camera 342 stops the image pickup while following the control from the control unit 282.

Figure 22:
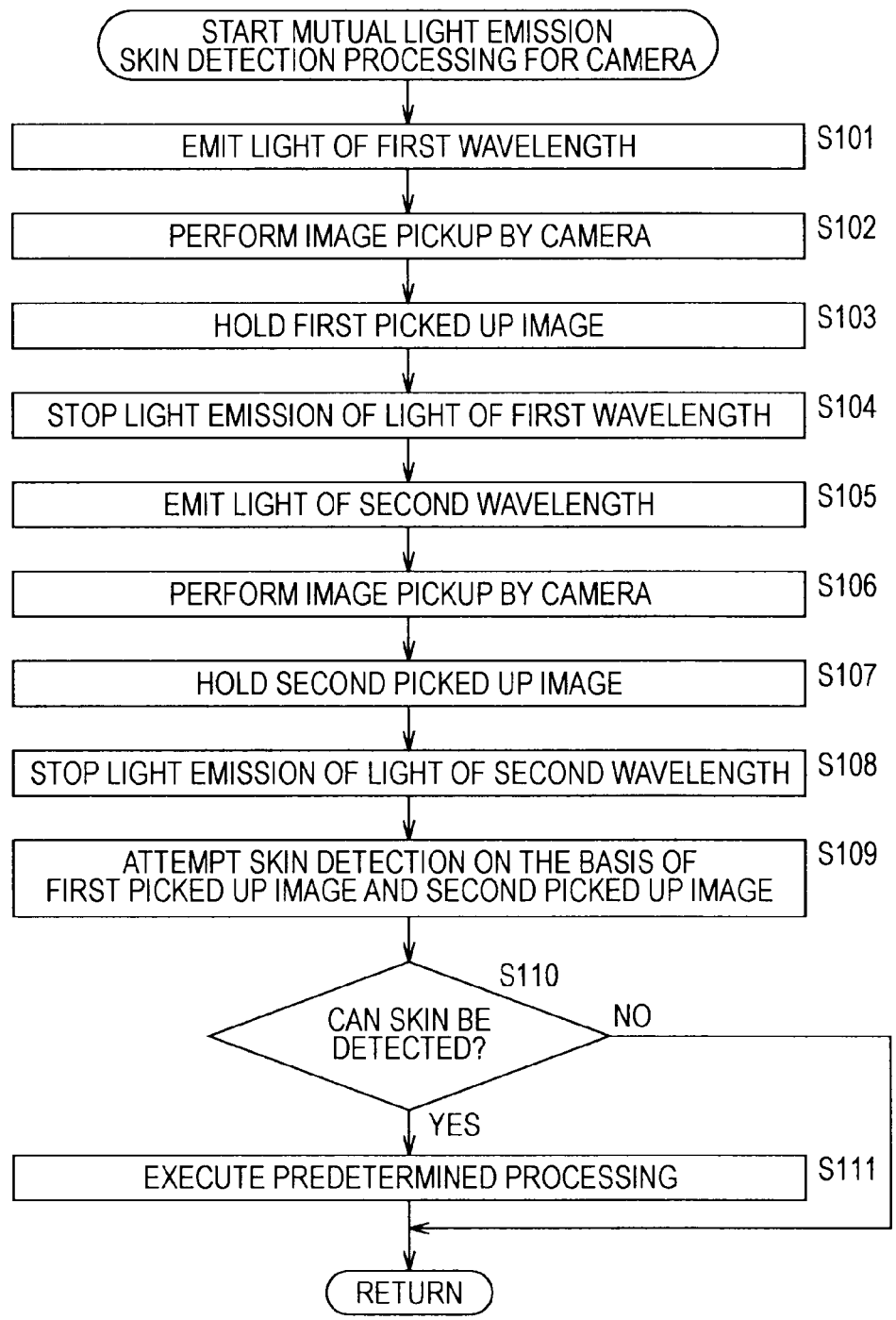
FIG. 22 is a flow chart for describing the mutual light emission skin detection processing for the camera.

In step S169 and step S171, a processing similar to step S109 to step S111 of FIG. 22 is carried out and returns to step S65 of FIG. 21.

As described above, in the simultaneous light emission skin detection processing for the camera, the LED 22 and the LED 24 are caused to emit the lights at the identical light emission timing, and on the basis of the first picked up image 301 and the second picked up image 302 picked up at the identical image pickup timing, it is determined whether or not the proximate object is the human skin.

Therefore, in the simultaneous light emission detection processing for the camera, as the first picked up image 301 and the second picked up image 302 are set to exist at the identical locations without deviating the respective positions of the subjects, and as compared with the case in which it is determined whether or not the object is the human skin on the basis of the first picked up image 301 and the second picked up image 302 picked up at different image pickup timings, it is possible to more accurately determine whether or not the proximate object is the human skin.

It should be noted that in a case where the operation mode of the skin sensor 321 is set as the sub active mode, the simultaneous light emission skin detection processing for the camera is carried out, for example, at the light emission timings (image pickup timings) tq (q=1, 5, . . . )

7. Modified Example

It should be noted that according to the first and second embodiments, the first wavelength emitted by the LED 22 is set as 870 [nm] and the second wavelength emitted by the LED 24 is set as 950 [nm], but the combination of the wavelengths is not limited to this.

That is, for the combination of the wavelengths, any combination may suffice so long as the combination has the sufficiently large difference value Vdif between the detection results V1 and V2 as compared with the difference value Vdif obtained for an object except for the human skin. To be specific, as apparent from FIG. 4, for example, other than the combination of 870 [nm] and 950 [nm], a combination of 800 [nm] and 950 [nm], a combination of 870 [nm] and 1000 [nm], a combination of 800 [nm] and 1000 [nm], and the like are available.

In other words, for example, for a combination between the first wavelength and the second wavelength, any combination may suffice so long as in the combination, the first wavelength is larger than or equal to 630 [nm] and smaller than or equal to 1000 [nm] and the second wavelength is larger than or equal to 900 [nm] and smaller than or equal to 1100 [nm] and also the first wavelength is a wavelength shorter than the second wavelength (the first wavelength<the second wavelength). This also similarly applies to the fifth and sixth embodiments.

In the mutual light emission skin detection processing and the simultaneous light emission skin detection processing described above, it is carried out until the object is determined as the human skin up to the limit of the number of times Th_N, but the method of determining whether or not the object is the human skin is not limited to this.

That is, for example, it is determined by the number of times Th_N whether or not the object is the human skin, and among determination results obtained as the result, a most-obtained determination result can be adopted as the final determination result. In this case, as compared with a case in which it is determined only by once whether or not the object is the human skin, it is possible to obtain a more accurate determination result.

Also, for example, in a case where the determination result that the object is the human skin is continuously obtained by the predetermined number of times or more, eventually, it may be determined that the object is the human skin.

Furthermore, in the mutual light emission skin detection processing and the simultaneous light emission skin detection processing, in a case where it is not determined that the object is the human skin, a predetermined processing is set to be executed, but it is not limited to this.

That is, for example, it can be configured that after it is determined that the object is the human skin, the determination is set to continue as to whether or not the object is the human skin, and while it is determined that the object is the human skin, the predetermined processing is set to be executed, and in a case where it is not determined that the object is the human skin, the predetermined processing is ended.

It should be noted that according to the second embodiment, the spectral filter 61a and the spectral filter 62a that are band-pass filters are used, but for the spectral filter 61a and 62a, it is possible to use a combination of a plurality of filters that are a filter that cuts (interrupts) a long wavelength, a filter that cuts a short wavelength, and the like. This also similarly applies to the sixth embodiment.

Also, according to the second embodiment, to irradiate the two PDs 61 and 62 with the reflected lights at the mutually different wavelengths, the spectral filters 61a and 62a are used, but it may be configured that optically, the reflected lights at mutually different wavelengths are converged on near sides of the PDs 61 and 62, the converged reflected lights are separated into the reflected lights at the mutually different wavelengths by a grating (diffraction grating) to be irradiated respectively on the PDs 61 and 62. This also similarly applies to the sixth embodiment.

Furthermore, according to the first to sixth embodiments, in the skin sensor 1, the skin sensor 41, the skin detection button 81, the skin sensor 261, and the skin sensor 321, it is determined whether or not the object is the human skin by setting two different wavelengths as one combination and using reflected lights of the lights at the wavelengths based on the one combination, but for example, it is possible to use reflected lights of lights at wavelengths respectively based on a plurality of different combinations.

That is, for example, on the basis of each of the plurality of different combinations, it is determined whether or not the object is the human skin, in a case where the determination results based on the plurality of combinations are an identical determination result, the determination result can be adopted as the final determination result, or among the determination results based on the plurality of combinations, a most-obtained determination result can be adopted as the final determination result.

In this case, as the final determination result is obtained on the basis of the plurality of determination results, it is possible to obtain the more accurate determination result.

Also, according to the first and second embodiments, the LED 22 is caused to emit the light as it is, but for example, it can be configured that a diffused plate or the like that diffuses the light emitted from the LED 22 uniformly as much as possible is provided on a front face of the LED 22.

In this case, as the light emitted from the LED 22 is uniformed, it is possible to maintain the intensity of the light irradiated from the LED 22 on the object to a constant intensity. For this reason, the intensity of the reflected light obtained by being irradiated on the object becomes constant, and in the PD 23, it is possible to improve the accuracy for detecting the intensity of the reflected light.

Also, according to the first and second embodiments, for example, by providing an optical element (such as a mirror or a prism) on the front surface of the LED 22 or in the vicinity of the light reception surface of the PD 23, a traveling direction of the light emitted from the LED 22 and a traveling direction of the reflected light can be set perpendicular to the light reception surface of the PD 23.

In this case, as the light emitted from the LED 22 is irradiated on the object substantially perpendicularly, it is possible to improve the irradiation efficiency of the light emitted for obtaining the reflected light. Also, as the reflected light is perpendicularly irradiated on the light reception surface of the PD 23, it is possible to improve the light reception efficiency by the PD 23.

Furthermore, to improve the irradiation efficiency, the light emitted from the LED 22 can be converged by providing a lens on the front surface of the LED 22.

It should be noted that for the above-mentioned series of configuration with regard to the LED 22, a similar matter also applies to the LED 24. Also, instead of using a plurality of LEDs such as the LED 22 and the LED 24, it is also possible to use an LED that can output a plurality of wavelengths alone.

Also, according to the fifth and sixth embodiments, in a case where it is configured that the diffused plate or the like is provided on the front surfaces of the LED 22 and the LED 24, the first and second picked up images has (almost) no illuminance unevenness can be obtained. For this reason, if the detection for the skin is carried out by using the above-mentioned first and second picked up images, as compared with the case in which the skin is detected through the configuration where diffused plate or the like is not provided on the front surfaces of the LED 22 and the LED 24, it is possible to further improve the accuracy for detecting the skin.

According to the fifth embodiment, in accordance with the operation mode of the skin sensor 261, the image pickup timing of the camera 281 as well as the light emission timings of the LED 22 and the LED 24 are changed, but it can be configured that only the light emission timings of the LED 22 and the LED 24 are changed. It should be noted that a similar matter also applies to the sixth embodiment.

To be specific, for example, according to the fifth embodiment, in a case where the operation mode of the skin sensor 261 is set as whichever, the camera 281 performs the image pickup at the image pickup timings t1, t2, t3, . . . illustrated in A of FIG. 17, and in accordance with the transition of the operation mode of the skin sensor 261, it is possible to change only the light emission timings of the LED 22 and the LED 24.

In this case, as the control unit 282 does not need to change the image pickup timing of the camera 281 in accordance with the transition of the operation mode of the skin sensor 261, as compared with the case in which the image pickup timing of the camera 281 as well as the light emission timings of the LED 22 and the LED 24 are changed in accordance with the transition of the operation mode, it is possible to facilitate the control performed by the control unit 282.

Also, for example, other than the change on the light emission timings of the LED 22 and the LED 24, either the light emission timing of the LED 22 or the light emission timing of the LED 24 may be changed in accordance with the transition of the operation mode of the skin sensor 261.

To be specific, for example, in a case where the transition is made from the active mode (corresponding to FIG. 17) to the sub active mode (corresponding to FIG. 18), A of FIG. 17 and B of FIG. 17 are respectively changed into A of FIG. 18 and B of FIG. 18, but with regard to C of FIG. 17, C of FIG. 17 may also remain without the change to C of FIG. 18.

According to the fifth and sixth embodiments, as the operation modes, the active mode, the sub active mode, the sleep mode, and the stop mode are provided, but the operation mode is not limited to this.

That is, for example, for the operation mode in which the mutual light emission skin detection processing for the camera and the simultaneous light emission skin detection processing for the camera are carried out, the two mode of the active mode and the sub active mode are provided, but other than that, for example, it is possible to provide one mode or three or more modes.

Also, for example, according to the fifth and sixth embodiments, when the power source is turned on, the transition is made to the active mode but may be configured, in addition, for example, to the sub active mode or the sleep mode.

Furthermore, for example, in the mode transition processing, in the motion determination processing in step S78, it is immediately determined that the object in motion exists within the image pickup range of the camera 281 in accordance with a situation it is determined by once that the motion exists, but other than that, for example, in the motion determination processing, it may be determined for the first time that the object in motion exists within the image pickup range of the camera 281 in a case where it is continuously determined on several occasions that the motion exists.

In this case, in the motion determination processing, it is possible to obtain more accurate determination result as compared with the case in which it is immediately determined that the object in motion exists within the image pickup range of the camera 281 in accordance with the situation it is determined by once that the motion exists.

Also, instead of the skin sensor 1 illustrated in FIG. 8 and the skin sensor 1 illustrated in FIG. 9 to FIG. 13, it is possible to adopt the skin sensor 261 according to the fifth embodiment and the skin sensor 321 according to the sixth embodiment.

It should be noted that in the object proximity determination processing performed by the skin sensor 1 according to the first embodiment, since the object proximity determination processing is started until it is determined that the object is proximate, among the LED 22 or the LED 24, for example, the LED 22 is caused to continue to emit the light, but for example, the LED 22 may be caused to emit the light for a predetermined light emission time from each of the predetermined light emission timings t1, t2, t3, . . . , and each time the LED 22 is caused to emit the light, on the basis of the reflected light of the light emitted from the LED 22, the object proximity determination processing of determining whether or not the object is proximate may be carried out.

In this case, for example, as compared with the case in which the LED 22 is caused to continue to emit the light, it is possible to carry out the object proximity determination processing in which the consumed power of the LED 22 is suppressed.

It should be noted that if the concept of the operation mode described according to the fifth and sixth embodiments is adopted with respect to the object proximity determination processing performed by the skin sensor 1 according to the first embodiment, it is possible to further suppress the power consumption.

That is, for example, for the operation mode of the skin sensor 1, it is possible to adopt the LED active mode in which LED 22 is caused to emit the light for a predetermined light emission time from each of the light emission timing t1, t2, t, 3, . . . , the LED sub active mode in which the LED 22 is caused to emit the light for a predetermined light emission time from each of the light emission timing t1, t3, t, 5, . . . , and the stop mode in which the light emission of the LED 22 is stopped, and the power supply of the skin sensor 1 is completely interrupted.

Then, in the object proximity determination processing performed by the skin sensor 1, in a case where the operation mode of the skin sensor 1 is set as the LED active mode, the LED 22 is caused to emit the light at the light emission timing corresponding to the LED active mode (for example, t1), and the object proximity determination processing is carried out. It should be noted that in this case, the LED mode information representing the LED active mode is set to be stored in the storage unit 26 of the skin sensor 1 as the LED mode information representing the operation mode of the skin sensor 1.

Also, in the object proximity determination processing performed by the skin sensor 1, while keeping the time, in a case where it cannot be determined that the object is proximate before a predetermined time elapses since the LED 22 is caused to emit the light in accordance with the LED active mode, the control unit 25 updates the LED mode information stored in the storage unit 26 to the LED mode information representing the LED sub active mode, and shifts the operation mode of the skin sensor 1 from the LED active mode to the LED sub active mode.

In a case where the operation mode of the skin sensor 1 is set as the LED sub active mode, the LED 22 is caused to emit the light at the light emission corresponding to the LED sub active mode (for example, t3), and the object proximity determination processing is carried out. Then, in a case where it is not determined through the object proximity determination processing that the object comes close, the LED 22 is caused to emit the light at the next light emission timing (for example, t5), and the object proximity determination processing is newly carried out.

In a case where the operation mode of the skin sensor 1 is set as the LED sub active mode, while keeping the time, for the LED 22, in a case where it cannot be determined that the object is proximate before a predetermined time elapses since the LED 22 is caused to emit the light at the light emission timing corresponding to the LED sub active mode, the control unit 25 updates the LED mode information stored in the storage unit 26 to the LED mode information representing the stop mode, and shifts the operation mode of the skin sensor 1 from the LED sub active mode to the stop mode.

Then, the control unit 25 is set to completely interrupt the power supply of the skin sensor 1 in accordance with the transition of the operation mode of the skin sensor 1 to the stop mode. It should be noted that in this case, the control unit 25 may put the skin sensor 1 in the sleep state instead of completely interrupting the power supply of the skin sensor 1.

Also, in a case where the operation mode of the skin sensor 1 is set as the LED sub active mode, before the predetermined time elapses since the LED sub active mode is set, in a case where it can be determined that the object is proximate, the control unit 25 updates the LED mode information stored in the storage unit 26 to the LED mode information representing the LED active stop mode and shifts the operation mode of the skin sensor 1 from the LED sub active mode to the LED active mode.

It should be noted that in a case where it is determined through the object proximity determination processing that the object comes close, the skin determination processing of determining whether or not the proximal object is the human skin is carried out. Then, after the end of the skin determination processing, the skin determination processing is newly carried out.

Then, after the operation mode of the skin sensor 1 is shifted from the LED sub active mode to the LED active mode, in the skin determination processing newly carried out, the LED 22 is caused to emit the light in accordance with the LED active mode.

It should be noted that in the object proximity determination processing, the operation mode of the skin sensor 1 is not limited to the LED active mode, and various changes can be made similarly as in the LED sub active mode, and the sleep mode, and the operation mode of the skin sensor 261 according to the fifth embodiment.

It should be noted that in the present specification, steps for describing the mutual light emission skin detection processing, the simultaneous light emission skin detection processing, the mode transition processing, the mutual light emission skin detection processing for the camera, the motion determination processing, and the simultaneous light emission skin detection processing for the camera include of course the processing executed in a time sequence manner along the stated order and also the processing executed in parallel or individually instead of not necessarily being processed in the time sequence manner.

Also, the embodiments of the present invention are not limited to the above-mentioned first to sixth embodiments, but various changes can be made within a range without departing the gist of the present invention.

REFERENCE SIGNS LIST

1 skin sensor
21 supporting board
22 LED
23 PD
24 LED
25 control unit
26 storage unit
41 skin sensor
61, 62 PD
61a, 62a spectral filter
81 skin detection button
261 skin sensor
281 camera
282 control unit
321 skin sensor
341 camera
341a spectral filter
342 camera
342a spectral filter

The invention claimed is:

1. A switching apparatus that switches a state of a predetermined electric circuit by detecting a proximity of an object, the switching apparatus comprising:
a first light source configured to emit light of a first wavelength;
a second light source configured to emit light of a second wavelength that is different from the first wavelength;
a sensor configured to detect reflected light obtained while the lights of the first and second wavelength are reflected; and
a control unit configured to
determine whether a distance to the object is within a predetermined distance based on whether an intensity of the reflected light is larger than or equal to a predetermined threshold;
change a control mode for controlling light emission by at least one of the first and second light source when it is determined that the distance to the object is within the predetermined distance;
control at least one of the first and second light source to emit light in accordance with the control mode;
determine whether the object is human skin on the basis of the reflected lights; and
switch the predetermined electric circuit in either state of a first state or a second state that is different from the first state from the first state to the second state in a case where it is determined that the object is the human skin.

2. The switching apparatus according to claim 1, comprising:
wherein in a case where it is determined that the distance with the object is within the predetermined distance, the control is configured to
detect an intensity of each of the reflected lights obtained while the lights of the first and second wavelengths are reflected,
determine whether the object is the human skin on the basis of the intensity of the reflected lights of the first and second wavelengths, and
switch the predetermined electric circuit from the first state to the second state when it is determined that the object is the human skin.

3. The switching apparatus according to claim 2, wherein the first and second light sources simultaneously emit the lights, and
the control unit is configured to
separate each of the reflected lights obtained while the lights of the first and second wavelengths are reflected for each wavelength; and
detect an intensity of one separated reflected light among the reflected lights of the lights of the first and second wavelengths and also detects an intensity of the other separated reflected light.

4. The switching apparatus according to claim 1, wherein the control unit is configured to
keep time;
perform a change to a control mode in which the light is emitted in a frequency smaller than the currently set control mode in a case where it is not determined that the distance with the object is within the predetermined distance before a predetermined time elapses since the time is kept; and
perform a change a controlling mode in which the light is emitted in a frequency larger than the currently set control mode in a case where it is determined that the distance with the object is within the predetermined distance before the predetermined time elapses since the time is kept.

5. The switching apparatus according to claim 3, wherein the image pickup apparatus is configured to:
generate the first picked up image on the basis of the reflected light obtained while the light of the first wavelength obtained through the separation is reflected; and
generate the second picked up image on the basis of the reflected light obtained while the light of the second wavelength obtained through the separation is reflected.

6. The switching apparatus according to claim 1, wherein the first and second light sources emit lights at wavelengths at which a difference absolute value between an amount of reflection of the reflected light obtained while the light of the first wavelength is irradiated and an amount of reflection of the reflected light obtained while the light of the second wavelength is irradiated with respect to the human skin is larger than or equal to a predetermined threshold.

7. The switching apparatus according to claim 6, wherein the first light source emits light at a wavelength larger than or equal to 630 [nm] and smaller than or equal to 1000 [nm] as the light at a wavelength shorter than the light emitted by the second light source, and
the second light source emits the light at a wavelength larger than or equal to 900 [nm] and smaller than or equal to 1100 [nm].

8. The switching apparatus according to claim 7, wherein the first and second light sources emit mutually different infrared lights.

9. The switching apparatus according to claim 8, wherein the first and second light sources emit light at a wavelength larger than or equal to 940 [nm] and light smaller than 940 [nm] as the mutually different infrared lights.

10. A switching apparatus that switches a state of a predetermined electric circuit by detecting a proximity of an object, the switching apparatus comprising:
a first light source configured to emit light of a first wavelength;
a second light source configured to emit light of a second wavelength that is different from the first wavelength;
a sensor configured to detect reflected light obtained while the lights of the first and second wavelength are reflected; and
a control unit configured to
determine whether the object is human skin on the basis of the reflected lights; and
switch the predetermined electric circuit in either state of a first state or a second state that is different from the first state from the first state to the second state in a case where it is determined that the object is the human skin, wherein
the first and second light sources alternately emit the lights, and
the control unit is configured to detect an intensity of the reflected light for each of reflected lights of the alternately emitted lights.

11. The switching apparatus according to claim 10, further comprising:
an image pickup apparatus configured to generate a first picked up image obtained by picking up an image of the object irradiated with the light of the first wavelength on the basis of the reflected light obtained while the light of the first wavelength is reflected and also generate a second picked up image obtained by picking up an image of the object irradiated with the light of the second wavelength on the basis of the reflected light obtained while the light of the second wavelength is reflected, wherein
the control unit uses the first and second picked up images generated on the basis of each of the reflected lights and determines whether or not the object is the human skin.

12. The switching apparatus according to claim 11, wherein the image pickup apparatus is configured to:
generate the first picked up image on the basis of the reflected light received in accordance with the light emission by the first light source; and
generate the second picked up image on the basis of the reflected light received in accordance with the light emission by the second light source.

13. A switching apparatus that switches a state of a predetermined electric circuit by detecting a proximity of an object, the switching a apparatus according to claim 11, wherein the control unit is further configured to comprising:
a first light source configured to emit light of a first wavelength;
a second light source configured to emit light of a second wavelength that is different from the first wavelength;
a sensor configured to detect reflected light obtained while the lights of the first and second wavelength are reflected; and
a control unit configured to
determine whether the object is human skin on the basis of the reflected lights; and
switch the predetermined electric circuit in either state of a first state or a second state that is different from the first state from the first state to the second state in a case where it is determined that the object is the human skin,
change the control mode for controlling the light emission by the first and second light sources in accordance with a frequency in which the control unit determines that the object is the human skin; and
cause the first and second light sources to emit the lights in the frequency for the light emission in accordance with the control mode.

14. The switching apparatus according to claim 13, wherein the control unit is further configured to:
keep time;
perform a change a control mode in which the light is emitted in a frequency smaller than the currently set control mode in a case where it is not determined that the object is the human skin before a predetermined time elapses since the time is kept; and
perform a change to a controlling mode in which the light is emitted in a frequency larger than the currently set control mode in a case where it is determined that the object is the human skin before the predetermined time elapses since the time is kept.

15. The switching apparatus according to claim 14, wherein
the control unit is configured to perform a change to a control mode in which only one of the first and second light sources is caused to emit the light in a case where it is not determined that the object is the human skin before the predetermined time elapses since the time is kept.

16. The switching apparatus according to claim 15, further comprising:
a motion detector configured to detect whether an object in motion exists in at least one of the first and second picked up images in a case where the control mode is the control mode in which only one of the first and second light sources is caused to emit the light, wherein the control unit is configured to perform a change to a control mode in which the first and second light sources are caused to emit the lights in a case where it is determined that the object in motion exists on the one picked up image.

17. The switching apparatus according to claim 16, wherein the control unit is configured to perform a change to a control mode in which only the first light source that emits the light of the first wavelength that is shorter than the second wavelength is caused to emit the light among the first and second light sources in a case where it is not determined that the object is the human skin before the predetermined time elapses since the time is kept.

* * * * *